(12) United States Patent
Ebrish et al.

(10) Patent No.: US 10,811,528 B2
(45) Date of Patent: Oct. 20, 2020

(54) TWO STEP FIN ETCH AND REVEAL FOR VTFETS AND HIGH BREAKDOWN LDVTFETS

(71) Applicant: International Business Machines Corporation, Armonk, NY (US)

(72) Inventors: Mona Ebrish, Albany, NY (US);
Xuefeng Liu, Schenectady, NY (US);
Brent Anderson, Jericho, VT (US);
Huiming Bu, Glenmont, NY (US);
Junli Wang, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/927,962

(22) Filed: Mar. 21, 2018

(65) Prior Publication Data
US 2019/0296142 A1 Sep. 26, 2019

(51) Int. Cl.
*H01L 29/78* (2006.01)
*H01L 21/8234* (2006.01)
*H01L 29/66* (2006.01)

(52) U.S. Cl.
CPC .. *H01L 29/7803* (2013.01); *H01L 21/823487* (2013.01); *H01L 29/6656* (2013.01);
(Continued)

(58) Field of Classification Search
CPC ........... H01L 29/7803; H01L 29/66492; H01L 29/7833; H01L 29/66712; H01L 29/6656;
(Continued)

(56) References Cited

U.S. PATENT DOCUMENTS

| | | |
|---|---|---|
| 5,091,324 A | 2/1992 | Hsu et al. |
| 7,723,192 B2 | 5/2010 | Carter et al. |

(Continued)

FOREIGN PATENT DOCUMENTS

JP 2016127141 A 7/2016

OTHER PUBLICATIONS

English Translation of JP2016127141A by Suzuki Toru et al., Jul. 11, 2016 (18 pages).

*Primary Examiner* — Khiem D Nguyen
(74) *Attorney, Agent, or Firm* — Daniel Morris; Michael J. Chang, LLC

(57) ABSTRACT

High breakdown voltage devices are provided. In one aspect, a method of forming a device having a VTFET and a LDVTFET includes: forming a LDD in an LDVTFET region; patterning fin(s) in a VTFET region to a depth D1; patterning fin(s) in the LDVTFET region, through the LDD, to a depth D2>D1; forming bottom source/drains at a base of the VTFET/LDVTFET fins; burying the VTFET/LDVTFET fins in a gap fill dielectric; recessing the gap fill dielectric to full expose the VTFET fin(s) and partially expose the LDVTFET fin(s); forming bottom spacers directly on the bottom source/drains in the VTFET region and directly on the gap fill dielectric in the LDVTFET region; forming gates alongside the VTFET/LDVTFET fins; forming top spacers above the gates; and forming top source/drains above the top spacers. A one-step fin etch and devices having VTFET and long channel VTFETs are also provided.

6 Claims, 14 Drawing Sheets

(52) U.S. Cl.
CPC .. *H01L 29/66492* (2013.01); *H01L 29/66712* (2013.01); *H01L 29/7833* (2013.01)

(58) Field of Classification Search
CPC ..... H01L 21/823487; H01L 21/823456; H01L 21/3081; H01L 21/3213; H01L 29/66666; H01L 29/7827; H01L 29/7835
See application file for complete search history.

(56) References Cited

U.S. PATENT DOCUMENTS

| | | | |
|---|---|---|---|
| 7,888,192 B2 | 2/2011 | Marshall et al. | |
| 7,902,599 B2 | 3/2011 | Carter et al. | |
| 8,174,058 B2 | 5/2012 | Marshall et al. | |
| 9,425,213 B1 | 8/2016 | Liu et al. | |
| 9,530,700 B1* | 12/2016 | Mallela | H01L 27/0924 |
| 9,564,437 B1* | 2/2017 | Basker | H01L 21/823821 |
| 9,773,901 B1* | 9/2017 | Gluschenkov | H01L 29/7827 |
| 9,793,374 B2* | 10/2017 | Anderson | H01L 21/823885 |
| 9,887,192 B2* | 2/2018 | Nowak | H01L 21/76895 |
| 9,911,738 B1* | 3/2018 | Niimi | H01L 27/092 |
| 9,984,937 B1* | 5/2018 | Bi | H01L 21/823412 |
| 10,008,417 B1* | 6/2018 | Bao | H01L 21/823487 |
| 10,032,679 B1* | 7/2018 | Guo | H01L 21/823821 |
| 10,062,752 B1* | 8/2018 | Leobandung | H01L 29/41741 |
| 10,283,565 B1* | 5/2019 | Xu | H01L 45/1608 |
| 10,319,836 B1* | 6/2019 | Reznicek | H01L 21/02636 |
| 10,418,288 B2* | 9/2019 | Bao | H01L 29/8083 |
| 10,504,794 B1* | 12/2019 | Lee | H01L 29/66553 |
| 2016/0099352 A1* | 4/2016 | Lee | H01L 29/0653 257/192 |
| 2016/0268400 A1 | 9/2016 | Akarvardar et al. | |
| 2016/0284800 A1 | 9/2016 | Yu et al. | |
| 2016/0293756 A1* | 10/2016 | Liu | H01L 29/7827 |
| 2017/0005012 A1 | 1/2017 | Liu et al. | |
| 2017/0352742 A1* | 12/2017 | Cheng | H01L 29/66666 |
| 2017/0358497 A1* | 12/2017 | Cheng | H01L 21/823418 |
| 2018/0005895 A1* | 1/2018 | Cheng | H01L 21/823487 |

* cited by examiner

US 10,811,528 B2

TWO STEP FIN ETCH AND REVEAL FOR VTFETS AND HIGH BREAKDOWN LDVTFETS

FIELD OF THE INVENTION

The present invention relates to vertical fin field-effect transistors (VTFETs), and more particularly, to high breakdown voltage lateral diffusion VTFETs (LDVTFETS) and techniques for integrating formation thereof in a VTFET process flow.

BACKGROUND OF THE INVENTION

Vertical fin field-effect transistors (VTFETs) are considered viable candidates for next generation complementary metal-oxide semiconductor (CMOS) building blocks in integrated circuit fabrication. By comparison with traditional finFETs, a VTFET has a current flow vertically from a bottom to a top of a vertical fin channel, with a control gate wrapped around the vertical fin channel for turning the transistor on and off.

The differences in device geometries between traditional lateral devices and VTFETs, however, present some notable challenges. For instance, in high voltage applications long channel devices have been implemented in planar device technology to increase breakdown voltage. With VTFETs, however, the fin height is fixed which in turn fixes the gate length. Thus, to-date, current VTFET technology does not provide a long channel device option.

Therefore, improved VTFET designs for high voltage application would be desirable.

SUMMARY OF THE INVENTION

The present invention provides high breakdown voltage lateral diffusion vertical fin field-effect transistors (LDVTFETS) and techniques for integrating formation thereof in a VTFET process flow. In one aspect of the invention, a method of forming a device having a VTFET and an LDVTFET is provided. The method includes: forming a lightly-doped drain (LDD) in an LDVTFET region of a wafer; selectively patterning a fin(s) in a VTFET region of the wafer to a depth D1; selectively patterning a fin(s) in the LDVTFET region of the wafer, through the LDD, to a depth D2, wherein D2>D1; forming bottom source and drains at a base of the fin(s) in the VTFET region and the fin(s) in the LDVTFET region; burying the fin(s) in the VTFET region and the fin(s) in the LDVTFET region in a gap fill dielectric; recessing the gap fill dielectric to fully expose the fin(s) in the VTFET region and partially expose the fin(s) in the LDVTFET region; forming bottom spacers directly on the bottom source and drains in the VTFET region of the wafer and directly on the recessed gap fill dielectric in the LDVTFET region of the wafer; forming gates alongside the fin(s) in the VTFET region and the fin(s) in the LDVTFET region above the bottom spacers; forming top spacers above the gates; and forming top source and drains above the top spacers at tops of the fin(s) in the VTFET region and the fin(s) in the LDVTFET region.

In another aspect of the invention, another method of forming a device having a VTFET and an LDVTFET is provided. The method includes: forming at least one LDD in an LDVTFET region of a wafer; concurrently patterning i) a fin(s) in a VTFET region of the wafer and ii) a fin(s) in the LDVTFET region of the wafer over the at least one LDD; selectively forming bottom source and drains at a base of the fin(s) in the VTFET region, and on the at least one LDD in the LDVTFET region; forming bottom spacers on the bottom source and drains; forming gates alongside the fin(s) in the VTFET region and the fin(s) in the LDVTFET region above the bottom spacers; forming top spacers above the gates; and forming top source and drains above the top spacers at tops of the fin(s) in the VTFET region and the fin(s) in the LDVTFET region.

In yet another aspect of the invention, a method of forming a device having a VTFET and a long channel VTFET is provided. The method includes: selectively patterning a fin(s) in a VTFET region of the wafer to a depth D'1; selectively patterning a fin(s) in a long channel VTFET region of the wafer to a depth D2, wherein D2>D'1; forming bottom source and drains at a base of the fin(s) in the VTFET region and the fin(s) in the long channel VTFET region; forming bottom spacers directly on the bottom source and drains in both the VTFET region and the long channel VTFET region of the wafer; forming gates alongside the fin(s) in the VTFET region and the fin(s) in the long channel VTFET region above the bottom spacers; forming top spacers above the gates; and forming top source and drains above the top spacers at tops of the fin(s) in the VTFET region and the fin(s) in the long channel VTFET region.

In still yet another aspect of the invention, a device is provided. The device includes: at least one VTFET on a wafer; and at least one LDVTFET on the wafer alongside the at least one VTFET, the at least one LDVTFET having at least one LDD that comprises a drift region of the LDVTFET.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for integrating high breakdown voltage lateral diffusion vertical fin field-effect transistors (VTFETs) (LDVTFETS) in a VTFET process flow. By "lateral diffusion" it is meant that a lightly-doped drain (LDD) region is formed extending 'laterally' away from the channel. This LDD region is an extension of the drain and has a lower dopant concentration than the drain (i.e., "lightly-doped"). The present LDVTFETs are well suited for high voltage applications. Namely, the LDD serves as a drift region. A voltage drop across the drift region prevents higher applied voltages (e.g., 20 volts) from destroying the device.

In exemplary embodiments provided below, a deeper fin reveal is processed to form longer fins (corresponding to the LDVTFETs), which is performed in two steps. Namely, a first fin etch is used to form nominal fins for a nominal VTFET. The nominal VTFET is then blocked with a mask, and only the deep fin is exposed for deep fin reveal for the LDVTFETs.

This configuration provides several notable advantages. For instance, as highlighted above, the deeper fins offer a drift region for extended lightly-doped drain (LDD) for input/output I/O LDVTFET devices. A simplified process is also described herein where a single fin etch is used for both nominal and LDVTFET devices. Further, embodiments are also provided herein where the deep fins offer a longer fin channel device.

Advantageously, the present techniques enable co-fabrication of nominal VTFET and LDVTFETs on the same wafer with many of the process flow steps performed simultaneously, such as bottom/top spacers, gate formation, etc. Further, the drift region of the LDVTFETs can be independently implanted to the desirable breakdown level.

A first exemplary embodiment of the present techniques is now described by way of reference to FIGS. 1-10. In order to illustrate the compatibility of the process with a VTFET flow, this example describes the co-fabrication of at least one nominal VTFET and at least one LDVTFET alongside one another on the same wafer. While the figures depict a single "nominal" VTFET and a single LDVTFET, this is done merely for ease and clarity of description. It is to be understood that the present techniques can be implemented in the same manner described to produce multiple VTFETs and/or multiple LDVTFETs.

In this embodiment, a two-step fin etch/reveal is employed, first to form the fins for the nominal VTFET (hereinafter "VTFET") and then to form the deeper fins for the LDVTFET. However, an LDD region is first needed in the LDVTFET region of the wafer.

Figure 1:
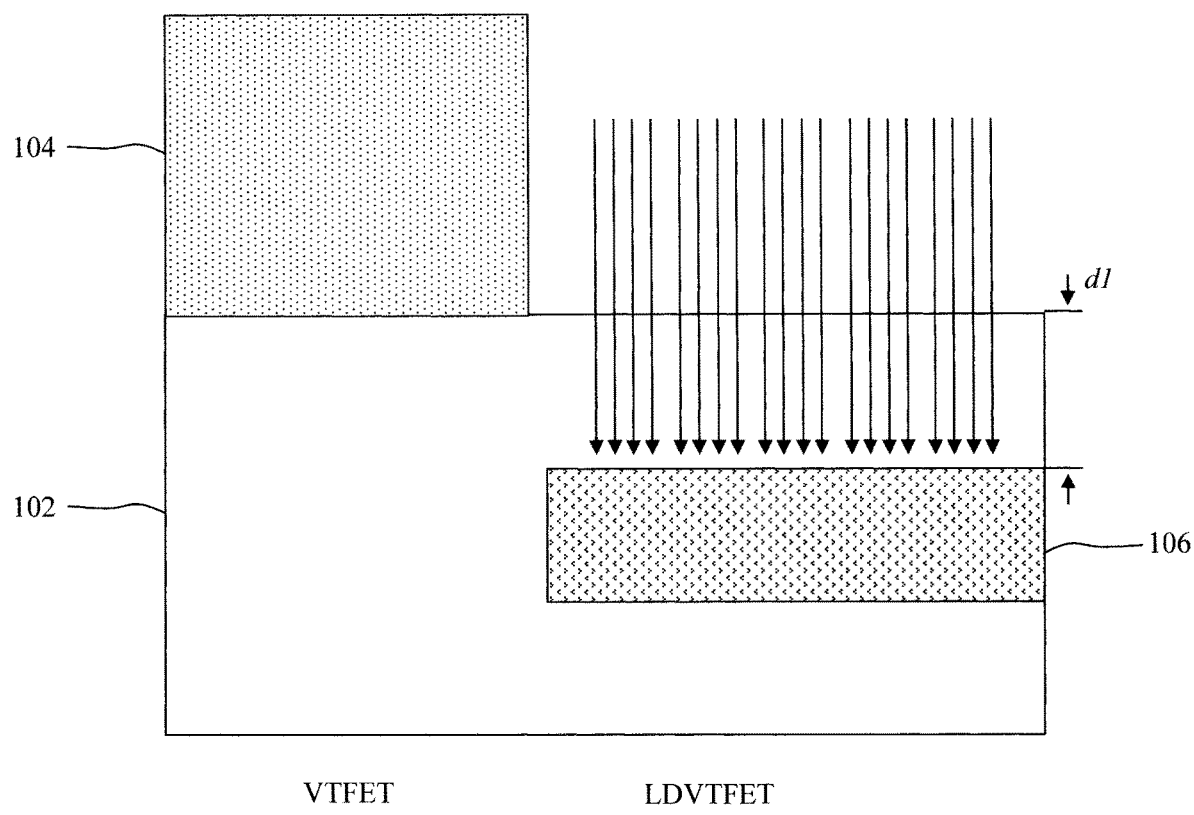
FIG. 1 is a cross-sectional diagram illustrating a wafer having a vertical fin field-effect transistor (VTFET) region and a lateral diffusion VTFET (LDVTFET) region, and selective lightly-doped drain (LDD) doping of the LDVTFET region of the wafer having been performed according to an embodiment of the present invention.

Namely, as shown in FIG. 1 the process begins with a wafer 102. According to an exemplary embodiment, the wafer 102 is a bulk semiconductor wafer, such as a bulk silicon (Si), bulk germanium (Ge) and/or bulk silicon germanium (SiGe) wafer. Alternatively, wafer 102 can be a semiconductor-on-insulator (SOI) wafer. In general, a SOI wafer includes a SOI layer separated from an underlying substrate by a buried insulator. When the buried insulator is an oxide it is referred to as a buried oxide or BOX. The SOI layer can include any suitable semiconductor, such as Si, Ge and/or SiGe.

At least one first active region and at least one second active region of wafer 102 are identified in the figures, one in which a VTFET will be formed (labeled "VTFET"), and another in which an LDVTFET will be formed (labeled "LDVTFET")—shown arbitrarily on the left and the right of the wafer 102, respectively.

Selective LDD doping of the LDVTFET region of the wafer 102 is next performed. To do so, a block mask 104 is formed over/covering the VTFET region of the wafer 102. A deep implant is then performed in the LDVTFET region of wafer 102 forming LDD region 106. According to an exemplary embodiment, the deep implant involves implanting dopants a distance d1 below the surface of wafer 102 in the LDVTFET region, wherein d1 is from about 20 nanometer (nm) to about 60 nm, and ranges therebetween. Suitable n-type dopants include, but are not limited to, phosphorous (P) and/or arsenic (As). Suitable p-type dopants include, but are not limited to, boron (B). According to an exemplary embodiment, the dopant concentration in LDD region 106 is from about $1\times10^{15}$ atoms per cubic centimeter (atoms/cm$^3$) to about $1\times10^{18}$ atoms/cm$^3$, and ranges therebetween.

Following the LDD deep implant, the block mask 104 is removed, and fins 204 are patterned in the VTFET region of the wafer 102. See FIG. 2. To do so, standard lithography and etching techniques are used to first form a patterned hardmask 202 on the wafer 102. The patterned hardmask 202 i) marks the footprint and location of the fins 204 in the VTFET region of wafer 102, and ii) blocks off the LDVTFET region of wafer 102. Suitable materials for the hardmask 202 include, but are not limited to, oxide hardmask materials such as silicon dioxide (SiO$_2$) and/or silicon carbon oxide (SiCO), and nitride spacer materials such as silicon nitride (SiN), silicon boron carbon nitride (SiBCN), silicon oxycarbon nitride (SiOCN), and/or silicon carbon nitride (SiCN). An anisotropic etching process such as reactive ion etching (RIE) can be employed for the fin etch.

Figure 2:
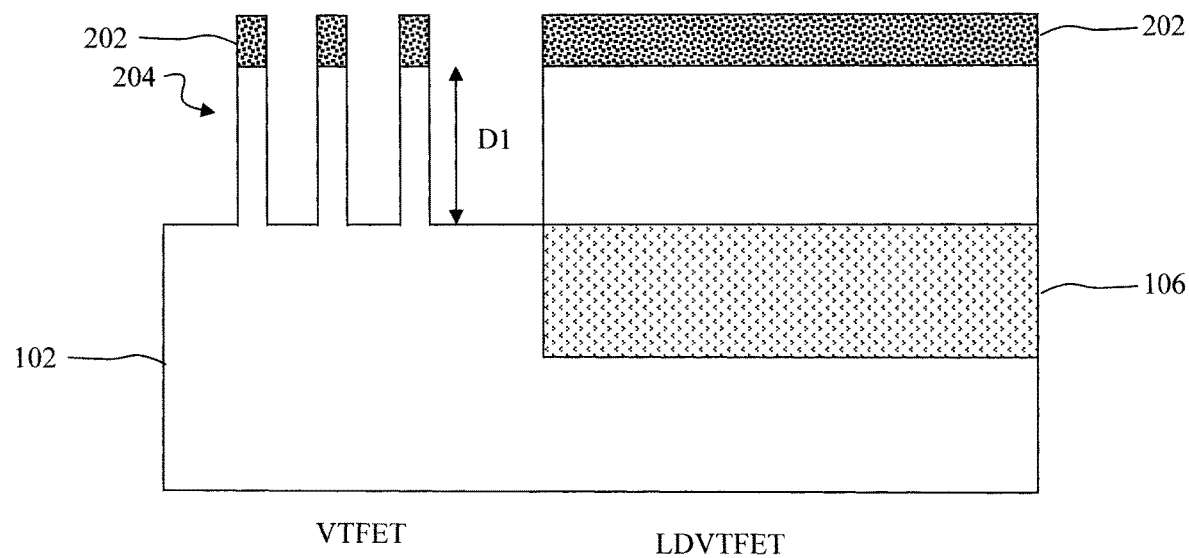
FIG. 2 is a cross-sectional diagram illustrating (first) fins having been patterned in the VTFET region of the wafer to a depth D1 according to an embodiment of the present invention.

The fins 204 will serve as the vertical fin channels of the VTFETs. According to an exemplary embodiment, the fins 204 are undoped. As shown in FIG. 2, the fins 204 are patterned to a depth D1 in the wafer 102. By way of example only, the depth D1 can be commensurate with the depth to which the LDD dopants are implanted below the surface of wafer 102, i.e., D1=d1.

With the patterning of fins 204 now complete in the VTFET region of wafer 102, the fins 204 are covered with a block mask 302 in order to enable selective processing of the LDVTFET region of the wafer 102. See FIG. 3. Standard lithography and etching techniques are then used to further pattern the hardmask 202 (now given reference numeral 202a) marking the footprint and location of fins 304 in the LDVTFET region of the wafer 102.

Figure 3:
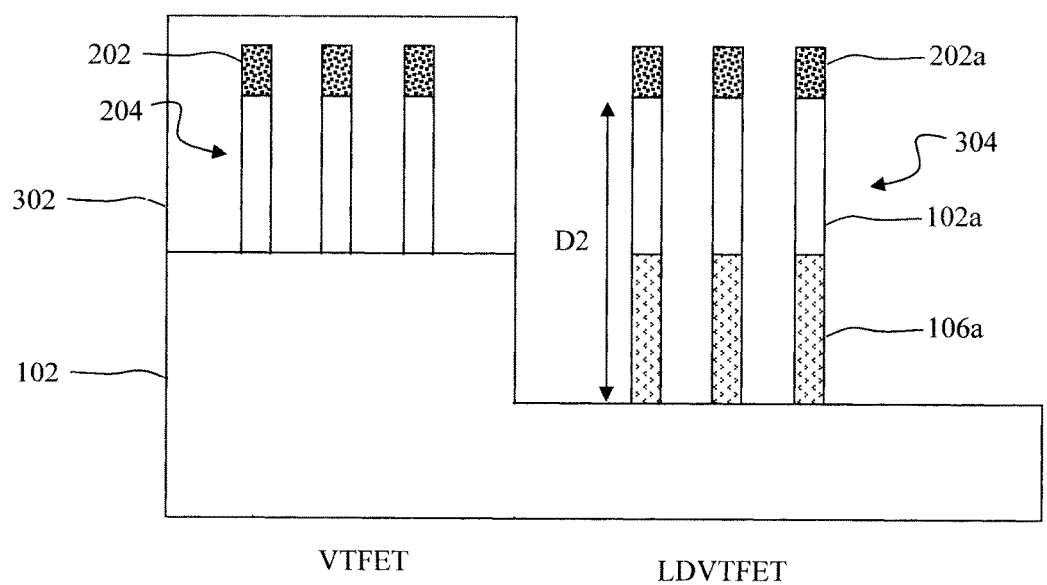
FIG. 3 is a cross-sectional diagram illustrating (second) fins having been patterned in the LDVTFET region of wafer, through the LDD, to a depth D2>D1 according to an embodiment of the present invention.

As shown in FIG. 3, the patterned hardmask 202a is then used to pattern the fins 304 in the LDVTFET region of wafer 102 extending down through the LDD region 106. As such, each fin 304 includes a portion 102a patterned in the wafer 102 and a portion 106a patterned in the LDD region 106. The portion 102a of the fins 304 will serve as the vertical fin channels of the LDVTFETs and, according to an exemplary embodiment, the portion 102a is undoped. The portion 106a of the fins 304 will serve as the LDD region of the LDVTFETs. Again, an anisotropic etching process such as RIE can be employed for the fin etch.

As shown in FIG. 3, the fins 304 are patterned to a depth D2 in the wafer 102. In the exemplary embodiment, Depth D2 is greater than depth D1 (i.e., the depth of the fins 204 in the VTFET region of wafer 102—see above, namely D2>DD. It is notable that, as shown in FIG. 3, the fins 204 and 304 can have the same pitch. Fin pitch is the distance from a given point on a fin to the same point on an adjacent fin. However, since the fins 204 and 304 are being patterned in two separate steps, the pitch of the VTFET fins is independent of the pitch of the LDVTFET fins, and embodiments are contemplated herein where the pitch of fins 204 is different from the pitch of fins 304.

Following the etch of fins 304, the block mask 302 can be removed, as well as the patterned hardmasks 202/202a. See FIG. 4. Bottom source and drains 402 are then formed at the base of the fins 204 and 304. Advantageously, post-fin patterning the same treatments are applied to the VTFET and LDVTFET regions, i.e., from this point forward in the process flow the VTFET and LDVTFET devices are processed concurrently.

Figure 4:
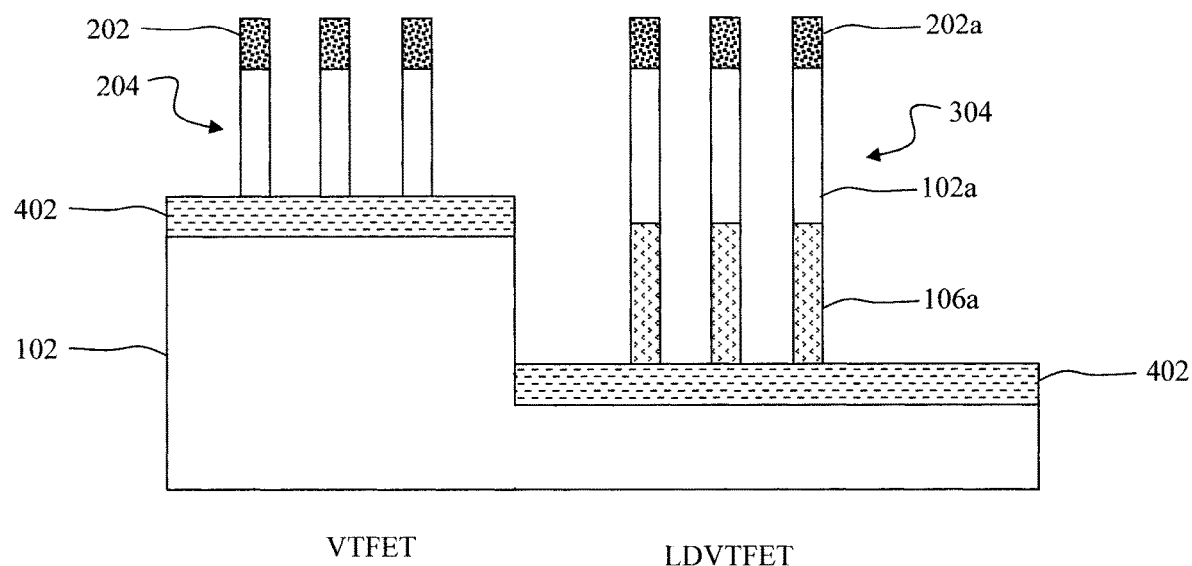
FIG. 4 is a cross-sectional diagram illustrating bottom source and drains having been formed at a base of the (first/second) fins according to an embodiment of the present invention.
Figure 5:
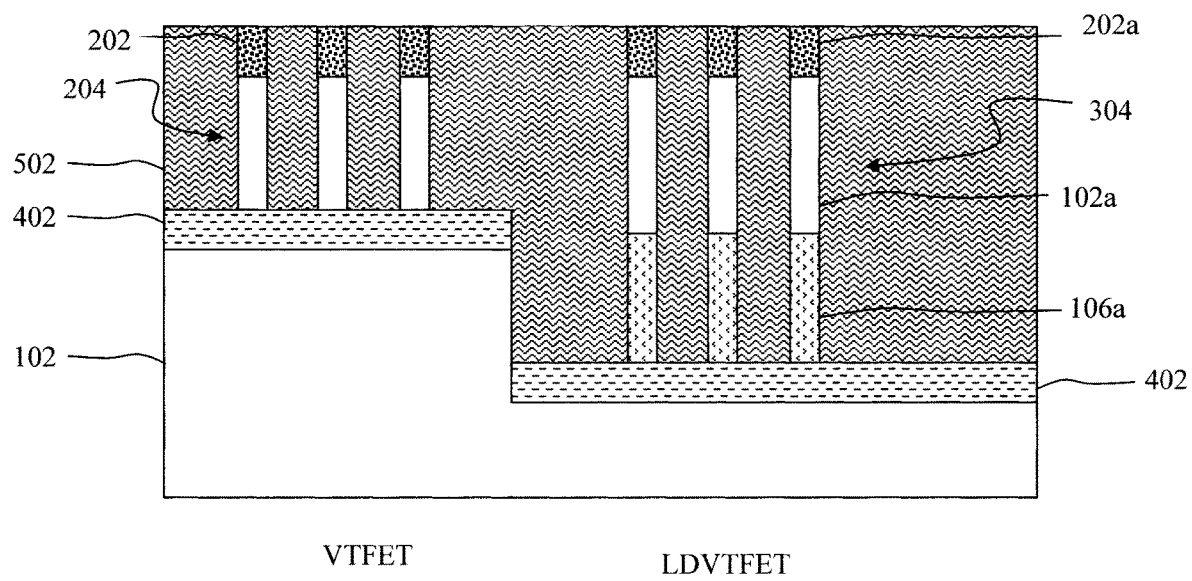
FIG. 5 is a cross-sectional diagram illustrating the (first/second) fins having been buried in a gap fill dielectric according to an embodiment of the present invention.

For instance, as shown in FIG. 4 the bottom source and drains 402 are formed concurrently at the base of the fins 204 and 304 in both the VTFET and LDVTFET regions of wafer 102. According to an exemplary embodiment, the bottom source and drains 402 are formed from a doped epitaxial material grown at the base of the fins 204 and 304. Suitable epitaxial materials for the bottom source and drains 402 include, but are not limited to, epitaxial Si, Ge and/or SiGe that is in-situ doped (i.e., during growth) or ex-situ doped (e.g., via a process such ion implantation) with an n-type or p-type dopant. As provided above, suitable n-type dopants include, but are not limited to, phosphorous (P) and/or arsenic (As), and suitable p-type dopants include, but are not limited to, boron (B).

In the present embodiment, the goal is to produce gates of the same length for both the VTFET and LDVTFET devices. Namely, the LDD region 106a will serve as the drift region in the LDVTFET devices for high voltage applications. In order to achieve a uniform gate length with the fins 204/304 patterned at different depths, the fins 204 and 304 are next buried in a gap fill dielectric 502. Suitable gap fill dielectrics 502 include, but are not limited to, oxides such as $SiO_2$, organic planarizing layers (OPL), etc.

Figure 6:
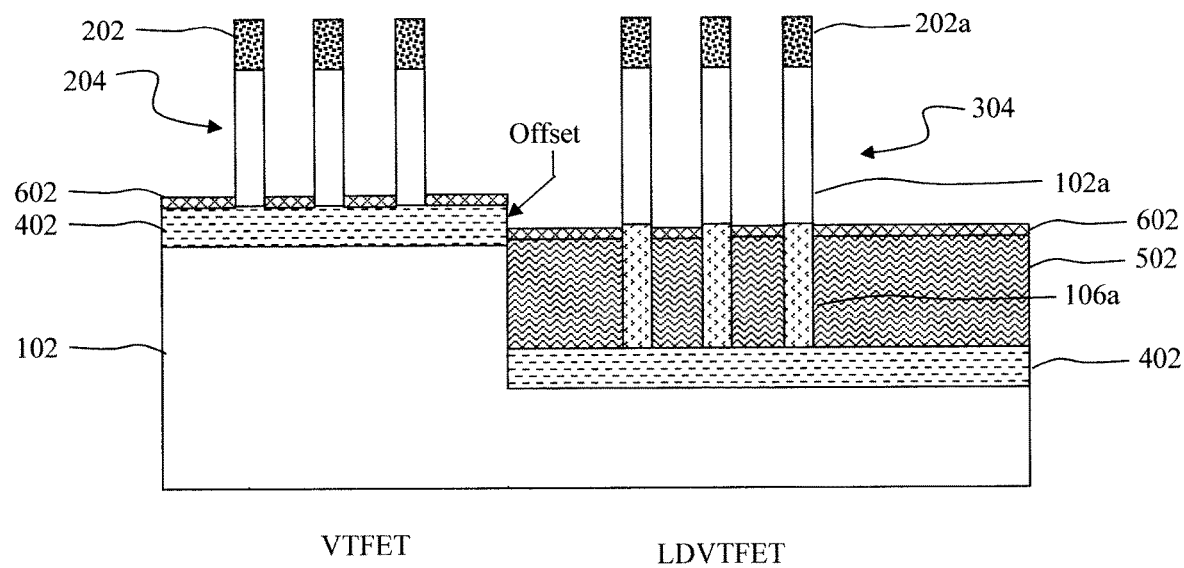
FIG. 6 is a cross-sectional diagram illustrating the gap fill dielectric having been recessed to fully expose the (first) fins and partially expose the (second) fins, and bottom spacers having been formed directly on the bottom source and drains in the VTFET region and directly on the (recessed) gap fill dielectric) in the LDVTFET region according to an embodiment of the present invention.
Figure 7:
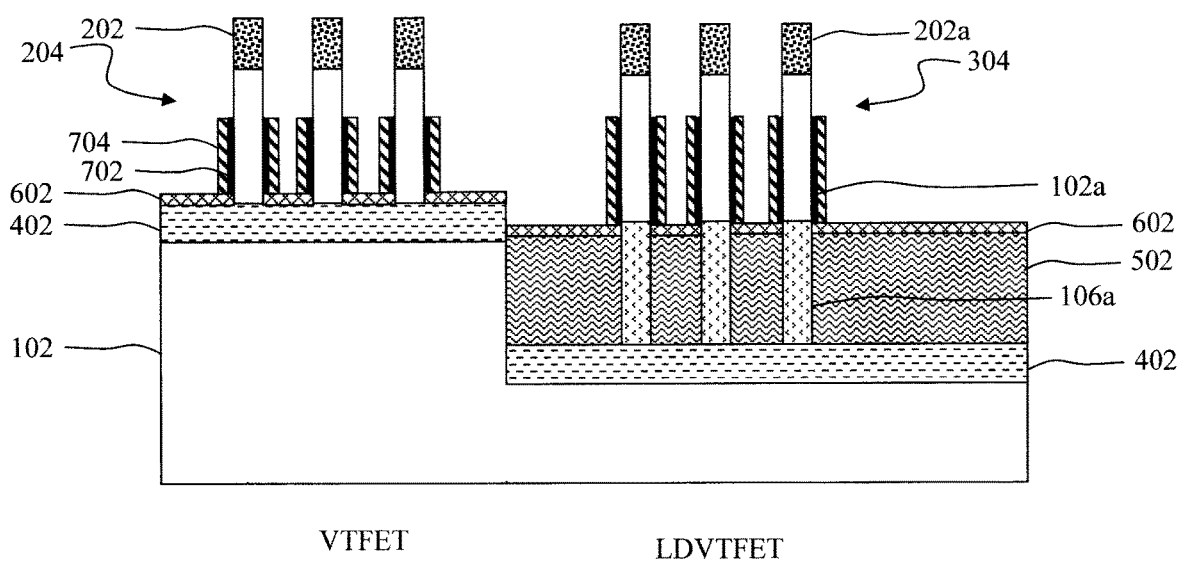
FIG. 7 is a cross-sectional diagram illustrating a gate dielectric having been deposited onto the (first/second) fins, and a gate conductor having been deposited onto the gate dielectric to form gates alongside the (first/second) fins according to an embodiment of the present invention.
Figure 8:
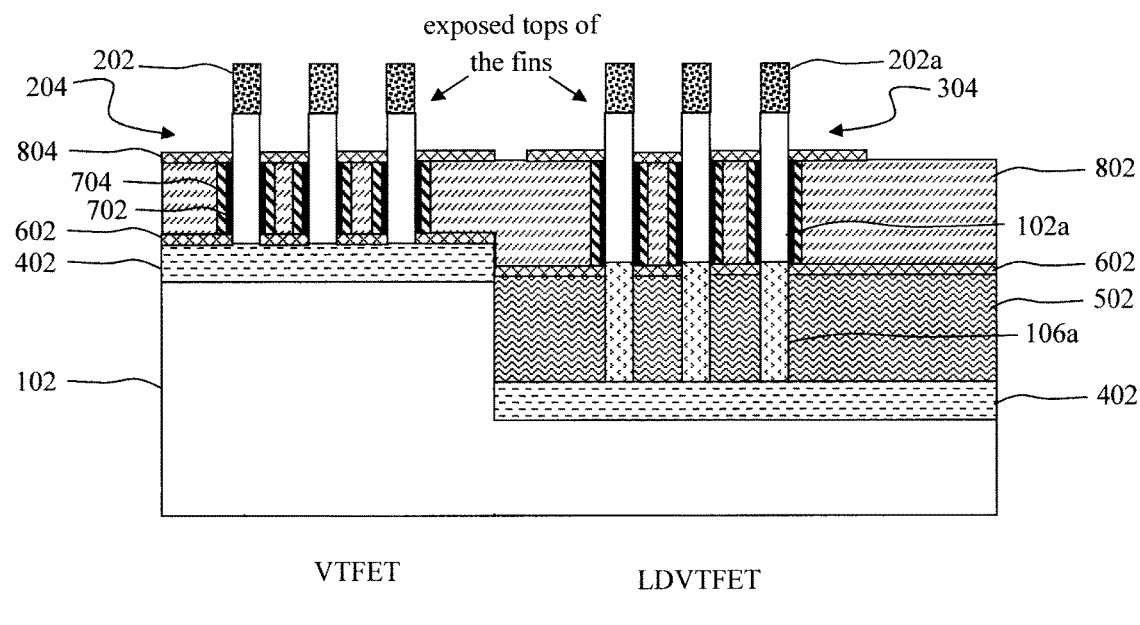
FIG. 8 is a cross-sectional diagram illustrating the (first/second) fins and the gates having been buried in a gap fill dielectric and the gap fill dielectric having been recessed below the tops of the (first/second) fins according to an embodiment of the present invention.
Figure 9:
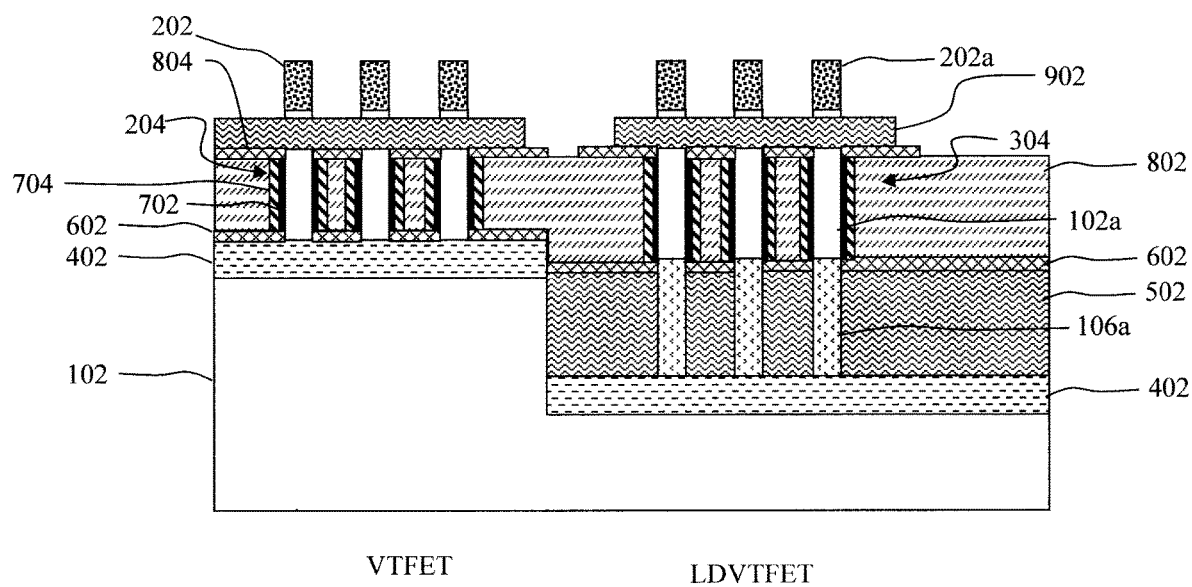
FIG. 9 is a cross-sectional diagram illustrating the (first/second) fins and the gates having been buried in a gap fill dielectric which is then recessed below the tops of the (first/second) fins, top spacers having been formed on the (recessed) gap fill dielectric above the gates, and top source and drains having been formed over the top spacers at the tops of the (first/second) fins according to an embodiment of the present invention.
Figure 10:
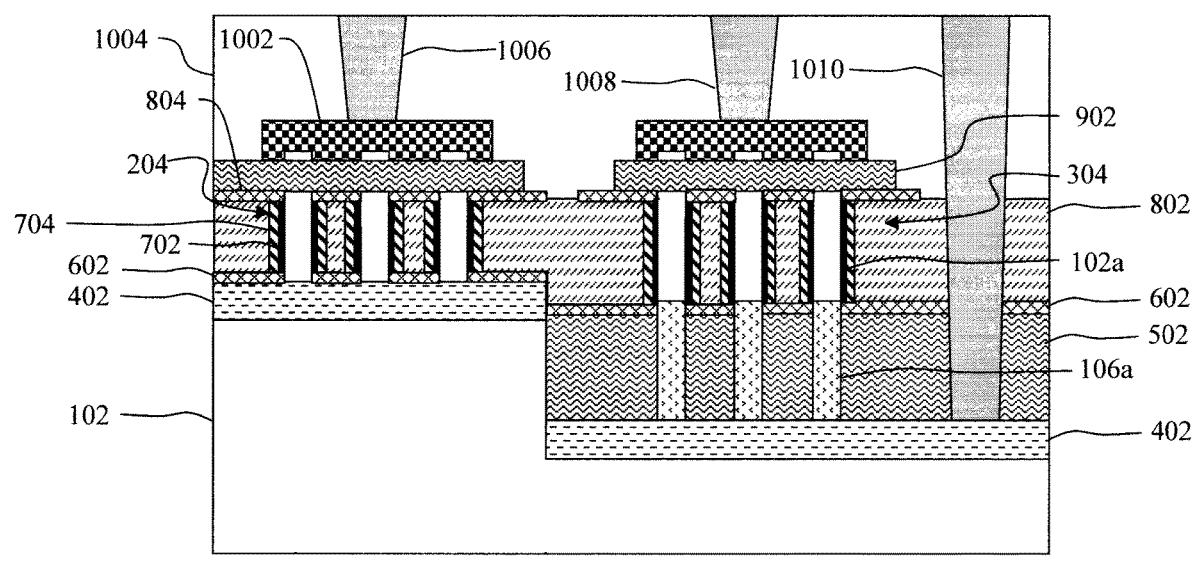
FIG. 10 is a cross-sectional diagram illustrating the VTFET and LDVTFET devices having been buried in an interlayer dielectric (ILD), and contacts having been formed in the ILD to the top source and drains of the VTFET and LDVTFET devices, and to the bottom source and drains of the LDVTFET devices according to an embodiment of the present invention.

The gap fill dielectric 502 is then recessed to expose the fins 204/304. See FIG. 6. By way of example only, the gap fill dielectric is recessed to the point where the fins 204 are fully exposed, and fins 304 are partially exposed (i.e., the recessed gap fill dielectric remains surrounding a bottom of the fins 304). Depositing and then recessing the gap fill dielectric 502 levels the gate length on both the VTFET and LDVTFET sides of the wafer 102. However, as shown in FIG. 6, if a timed etch (e.g., a RIE) is used to recess the gap fill dielectric 502, then the LDVTFET will be recessed slightly deeper than the VTFET. See offset shown in FIG. 6 between the two regions. This slight offset is due to etch selectivity during the recess etch between the bottom source and drains 402 in the VTFET region versus the remaining gap fill dielectric 502 in the LDVTFET region. Namely, according to an exemplary embodiment, following the recess etch gap fill dielectric 502 only remains in the LDVTFET region (i.e., gap fill dielectric 502 is completely removed from the VTFET region).

As shown in FIG. 6, bottom spacers 602 are then formed directly on the bottom source and drains 402 in the VTFET region and directly on the (recessed) gap fill dielectric 502 (over the bottom source and drains 402) in the LDVTFET region. Again, this formation of the bottom spacers 602 occurs concurrently in both (VTFET and LDVTFET) regions.

According to an exemplary embodiment, the bottom spacers 602 are formed using a directional deposition process whereby a spacer material is deposited onto the bottom source and drains 402 (in the VTFET region), and the recessed gap fill dielectric 502 (in the LDVTFET region) and fins 204/304 with a greater amount of the material being deposited on the horizontal surfaces, as compared to the vertical surfaces. Thus, when an etch is used on the spacer material, the timing of the etch needed to remove the spacer material from the vertical surfaces will leave the bottom spacers 602 shown in FIG. 6 on top of the bottom source and drains 402 (in the VTFET region) and on top of the recessed gap fill dielectric 502 (in the LDVTFET region) since a greater amount of the spacer material was present on these horizontal surfaces to begin with.

By way of example only, a high density plasma (HDP) chemical vapor deposition (CVD) or physical vapor deposition (PVD) process can be used for directional film deposition, and an isotropic etch can be used to remove the (thinner) spacer material deposited onto the vertical surfaces. Suitable materials for the bottom spacers 602 include, but are not limited to, oxide spacer materials such as $SiO_2$ and/or silicon carbon oxide (SiCO), and nitride spacer materials such as SiN, silicon boron carbon nitride (SiBCN), silicon oxycarbon nitride (SiOCN), and/or silicon carbon nitride (SiCN).

As noted above, there is a slight offset between the VTFET region and the LDVTFET region. As shown in FIG. 6, based on this offset the top surface of spacers 602 in the VTFET region is slightly higher than the top surface of spacers 602 in the LDVTFET region. To look at it another way, even though the bottom spacers 602 are formed concurrently across both (VTFET and LDVTFET) regions, there is a slight step in the bottom spacers 602 between the regions. According to an exemplary embodiment, the offset is from about 5 nanometers (nm) to about 10 nm, and ranges therebetween.

Gates (i.e., a gate dielectric and a gate conductor) are then formed alongside the fins 204/304 above the bottom spacers 602. According to an exemplary embodiment, the gates include a gate dielectric 702 that is deposited onto the fins 204/304, and a gate conductor 704 that is deposited onto the gate dielectric 702. See FIG. 7. Again, this formation of the gates occurs concurrently in both (VTFET and LDVTFET) regions. In one exemplary embodiment, the conformal gate conductor 704 is a workfunction-setting metal, and the conformal gate dielectric 702 is a high-K gate dielectric.

The particular workfunction-setting metal employed can vary depending on whether an n-type or p-type transistor is desired. Suitable n-type workfunction-setting metals include, but are not limited to, titanium nitride (TiN), tantalum nitride (TaN) and/or aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and/or tantalum aluminum carbide (TaAlC). Suitable p-type workfunction-setting metals include, but are not limited to, TiN, TaN, and/or tungsten (W). TiN and TaN are relatively thick (e.g., greater than about 2 nm) when used as p-type workfunction metals. However, very thin TiN or TaN layers (e.g., less than about 2 nm) may also be used beneath Al-containing alloys in n-type workfunction stacks to improve electrical properties such as gate leakage currents. Thus, there is some overlap in the exemplary n- and p-type workfunction metals given above.

The term "high-κ" as used herein refers to a material having a relative dielectric constant κ which is much higher than that of silicon dioxide (e.g., a dielectric constant κ=25 for hafnium oxide ($HfO_2$) rather than 4 for silicon dioxide). Suitable high-K gate dielectrics include, but are not limited to, $HfO_2$ and/or lanthanum oxide ($La_2O_3$).

As provided above, bottom spacers 602 are present on top of the bottom source and drain 402, separating the bottom source and drains 402 from the gates. Counterpart top spacers are needed above the gates (so as to separate the gates from the top source and drains—to be formed below). In order to enable further processing above the gates at the tops of the fins 204/304, the fins 204 and 304 and the gates are next buried in a gap fill dielectric 802. The gap fill dielectric 802 is then recessed below the tops of the fins 204/304. See FIG. 8. As provided above, suitable gap fill dielectrics 802 include, but are not limited to, oxides such as $SiO_2$, OPL, etc.

Top spacers 804 are then formed on the (recessed) gap fill dielectric 802 above the gates. See FIG. 8. Again, this formation of the top spacers 804 occurs concurrently in both (VTFET and LDVTFET) regions. As with the bottom spacers 602, top spacers 604 can be formed using a directional deposition process whereby a spacer material is deposited onto the recessed gap fill dielectric 802 above the gates with a greater amount of the material being deposited on the horizontal surfaces, as compared to the vertical surfaces. Thus, when an etch is used on the spacer material, the timing of the etch needed to remove the spacer material from the vertical surfaces will leave the top spacers 804 shown in FIG. 8 on top of recessed gap fill dielectric 802 since a greater amount of the spacer material was present on these horizontal surfaces to begin with.

As provided above, a HDP CVD or PVD process can be used for directional film deposition, and an isotropic etch can be used to remove the (thinner) spacer material deposited onto the vertical surfaces. As with the top spacers, suitable materials for the top spacers 804 include, but are not limited to, oxide spacer materials such as $SiO_2$ and/or SiCO, and nitride spacer materials such as SiN, SiBCN, SiOCN, and/or SiCN.

Top source and drains 902 are then formed over the top spacers 804 at the tops of the fins 204/304. Again, this formation of the top source and drains 902 occurs concurrently in both (VTFET and LDVTFET) regions. According to an exemplary embodiment, the top source and drains 902 are formed from a doped epitaxial material grown at the tops of the fins 204 and 304 over the top spacers 804. Suitable epitaxial materials for the top source and drains 902 include, but are not limited to, epitaxial Si, Ge and/or SiGe that is in-situ doped (i.e., during growth) or ex-situ doped (e.g., via a process such ion implantation) with an n-type or p-type dopant. As provided above, suitable n-type dopants include, but are not limited to, phosphorous (P) and/or arsenic (As), and suitable p-type dopants include, but are not limited to, boron (B).

Metallization is then performed to form contacts to the VTFET and LDVTFET devices. For instance, top source and drain contacts 1002 are formed (e.g., grown epitaxially) on the top source and drains 902. See FIG. 10. Next, the VTFET and LDVTFET devices are then buried in an interlayer dielectric (ILD) 1004. Contacts 1006 and 1008 are then formed in the ILD 1004 to the top source and drains of the VTFET and LDVTFET devices, respectively, and a contact 1010 is formed in the ILD 1004 to the bottom source and drains 402 of the LDVTFET devices.

According to an exemplary embodiment, the contacts 1006, 1008 and 1010 are formed by first patterning contact trenches in the ILD 1004, and then filling the contact trenches with a suitable contact metal such as copper (Cu), tungsten (W), titanium (Ti) and/or platinum (Pt) to form contacts 1006, 1008 and 1010.

In the exemplary embodiment just described, a two-step fin patterning process was employed. A simplified version of that process is also contemplated herein where the VTFET and LDVTFET share the same fin process. Namely, a single fin patterning step is used for both types (VTFET and LDVTFET) of devices. This alternative embodiment is now described by way of reference to FIGS. 11-18.

Figure 11:
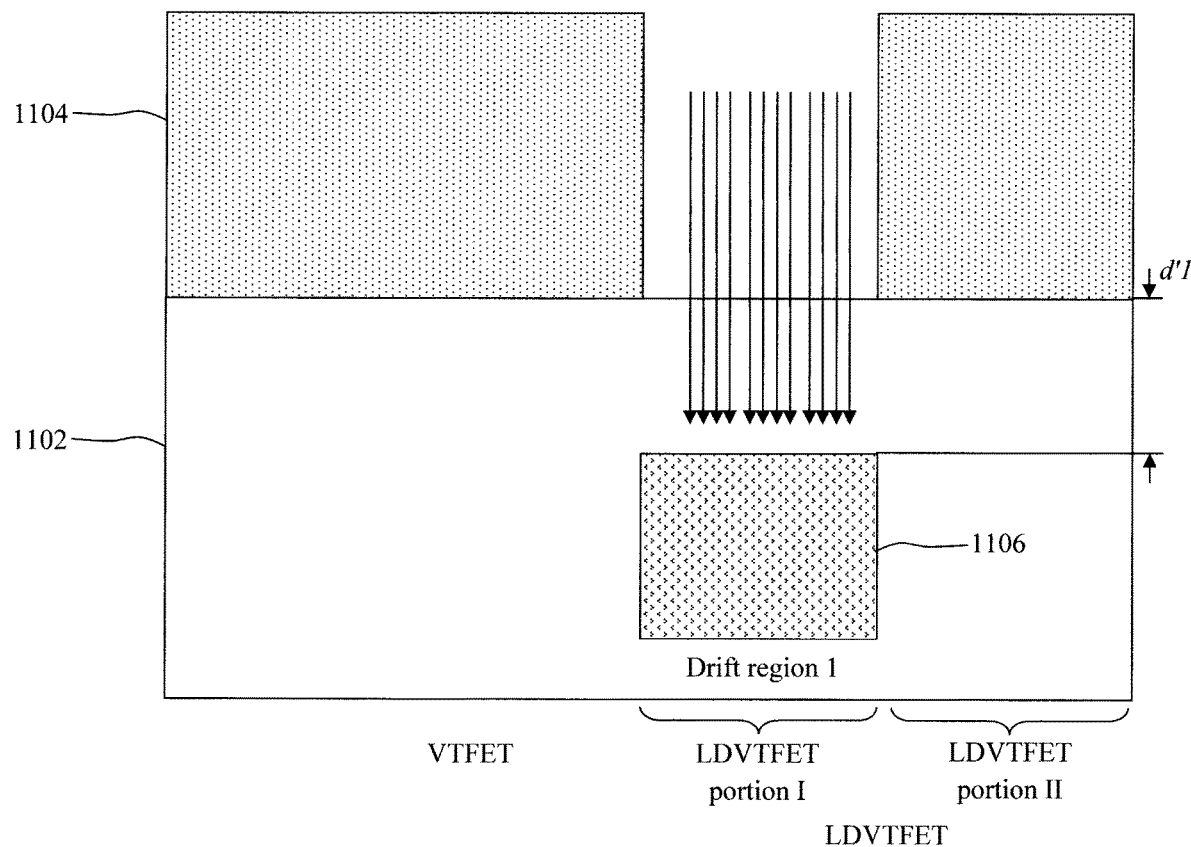
FIG. 11 is a cross-sectional diagram illustrating a wafer having a VTFET region and a LDVTFET region, and a (first) LDD having been formed in the LDVTFET region of the wafer according to an embodiment of the present invention.
Figure 12:
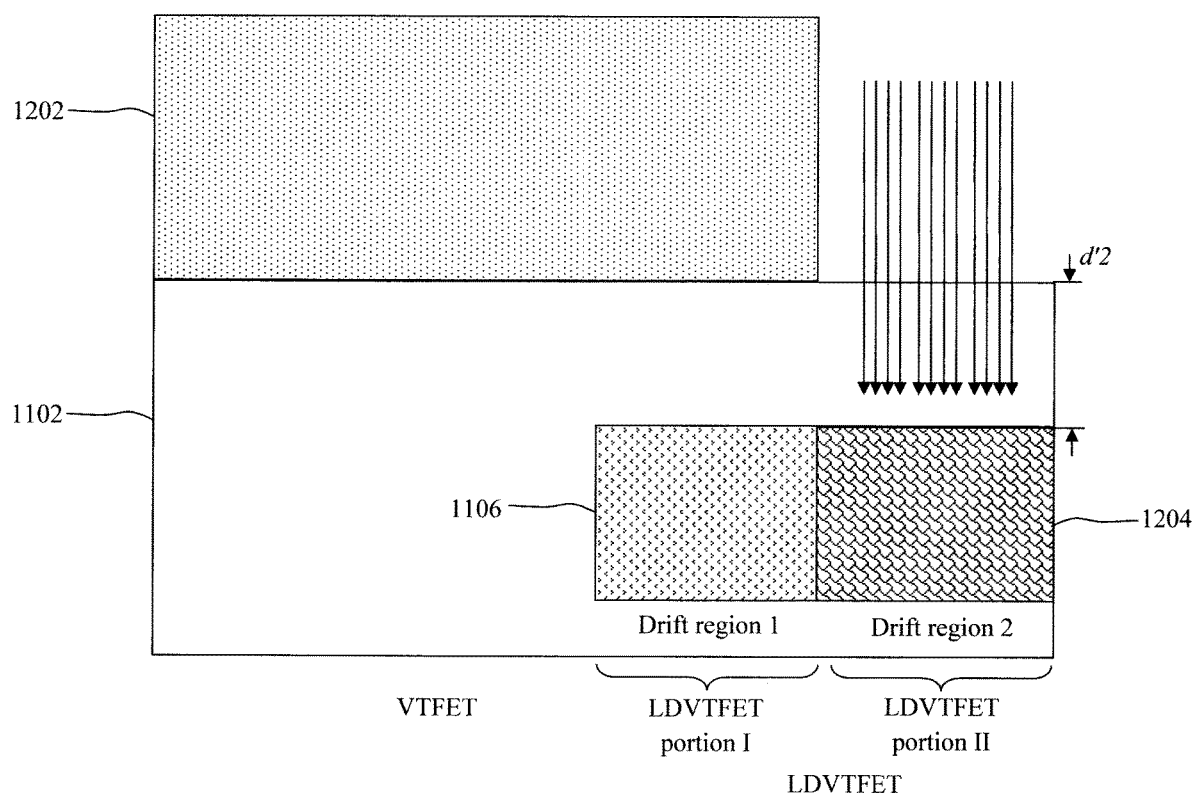
FIG. 12 is a cross-sectional diagram illustrating a (second) LDD having been formed in the LDVTFET region of the wafer according to an embodiment of the present invention.

In this version, the LDD region remains intact (i.e., LDVTFET fins are not patterned through the LDD region) and the bottom source and drains are relocated to an end of the LDD region opposite the LDVTFET fins. As shown in FIG. 11, the process begins in the same general manner as above with a (e.g., bulk semiconductor or SOI) wafer 1102 having at least one first active region and at least one second active region in which a VTFET and an LDVTFET will be formed, respectively.

Selective LDD doping of the LDVTFET region of the wafer 1102 is next performed. In the instant example, two LDD regions are formed with different dopant concentrations to illustrate how, in accordance with the present techniques, the drift regions of the LDVTFETs can be tuned to achieve an overall desired voltage breakdown level in the LDVTFETs. For instance, a gradual step down in the voltage passing through the LDVTFET can be achieved via multiple LDD (drift) regions. It is notable, however, that this configuration is merely an example and embodiments are contemplated herein where a single LDD region is employed (as in the first exemplary embodiment) and/or where more than two LDD regions are present.

As shown in FIG. 11, a (first) block mask 1104 is formed on the wafer 1102 over/covering the VTFET region and a select second portion (portion II) of the LDVTFET region. A (first) deep implant is then performed in a first portion (portion I) of the LDVTFET region forming (first) LDD region 1106. According to an exemplary embodiment, the deep implant involves implanting dopants a distance d'1 below the surface of wafer 1102 in portion I of the LDVTFET region, wherein d'1 is from about 20 nm to about 60 nm, and ranges therebetween. As provided above, suitable n-type dopants include, but are not limited to, phosphorous (P) and/or arsenic (As), and suitable p-type dopants include, but are not limited to, boron (B).

Following the first LDD deep implant, the block mask 1104 is removed and a (second) block mask 1202 is formed on the wafer 1102 over/covering the VTFET region and the first portion I of the LDVTFET region. See FIG. 12. A (second) deep implant is then performed in the portion II of the LDVTFET region forming (second) LDD region 1204. According to an exemplary embodiment, the deep implant into portion II of the VTFET region involves implanting dopants a distance d'2 below the surface of wafer 1102 (wherein d'2=d'1). As provided above, suitable n-type dopants include, but are not limited to, phosphorous (P) and/or arsenic (As), and suitable p-type dopants include, but are not limited to, boron (B).

According to an exemplary embodiment, LDD region 1106 has a dopant concentration c1 and LDD region 1204 has a dopant concentration c2, wherein c1>c2. For instance, by way of example only, the dopant concentration c1 in LDD region 106 is from about $1\times10^{17}$ atoms/cm$^3$ to about $1\times10^{18}$ atoms/cm$^3$, and ranges therebetween, while the dopant concentration c2 in LDD region 1204 is from about $1\times10^{15}$ atoms/cm$^3$ to about $1\times10^{16}$ atoms/cm$^3$, and ranges therebetween.

The LDD regions 1106 and 1204 will serve as the drift regions in the LDVTFET devices for high voltage applications. As such, LDD regions 1106 and 1204 are labeled in the figures as "Drift region 1" and "Drift region 2," respectively.

Figure 13:
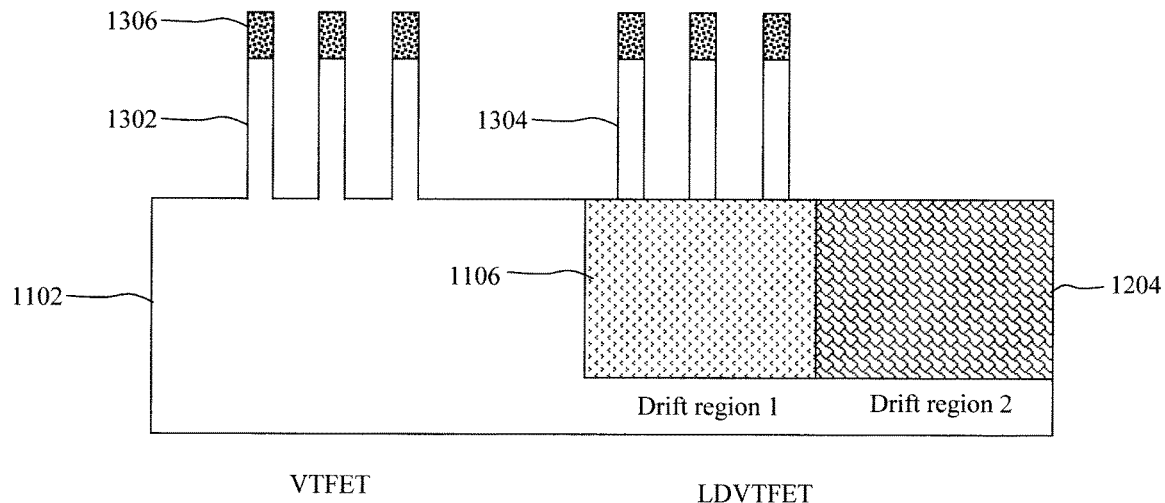
FIG. 13 is a cross-sectional diagram illustrating fins having been patterned concurrently in both the VTFET and LDVTFET regions of wafer according to an embodiment of the present invention.

Next, fins 1302 and 1304 are patterned concurrently (i.e., in a single step) in both the VTFET and LDVTFET regions of wafer 1102, respectively. See FIG. 13. For instance, as shown in FIG. 13 a patterned hardmask 1306 is formed on the wafer 1102 marking i) the footprint and location of the fins 1302 in the VTFET region of wafer 1102, and ii) the footprint and location of the fins 1304 in the LDVTFET region of wafer 1102. In this example involving two LDD (drift) regions 1106 and 1204, the LDVTFET fins 1304 are preferably patterned over the (first) LDD region 1106. As provided above, LDD region 1106 has a higher dopant concentration than LDD region 1204. Thus, voltage through the LDVTFET will pass through LDD region 1106 first followed by LDD region 1204.

As provided above, suitable materials for the hardmask 1306 include, but are not limited to, oxide hardmask materials such as $SiO_2$ and/or SiCO, and nitride spacer materials such as SiN, SiBCN, SiOCN, and/or SiCN. An anisotropic etching process such as RIE can be employed for the fin etch.

The fins 1302 and 1304 will serve as the vertical fin channels of the VTFET and LDVTFET, respectively. According to an exemplary embodiment, the fins 1302 and 1304 are undoped. As shown in FIG. 13, the fins 1302 and 1304 are both patterned to a uniform depth in the wafer 1102. Advantageously, combining the VTFET and LDVTFET fin etch into a single fin patterning step streamlines the process flow. By comparison, in the first exemplary embodiment provided above, separate lithography and etching steps were required (i.e., a two-step fin etch) to pattern the VTFET and LDVTFET fins to different depths.

Figure 14:
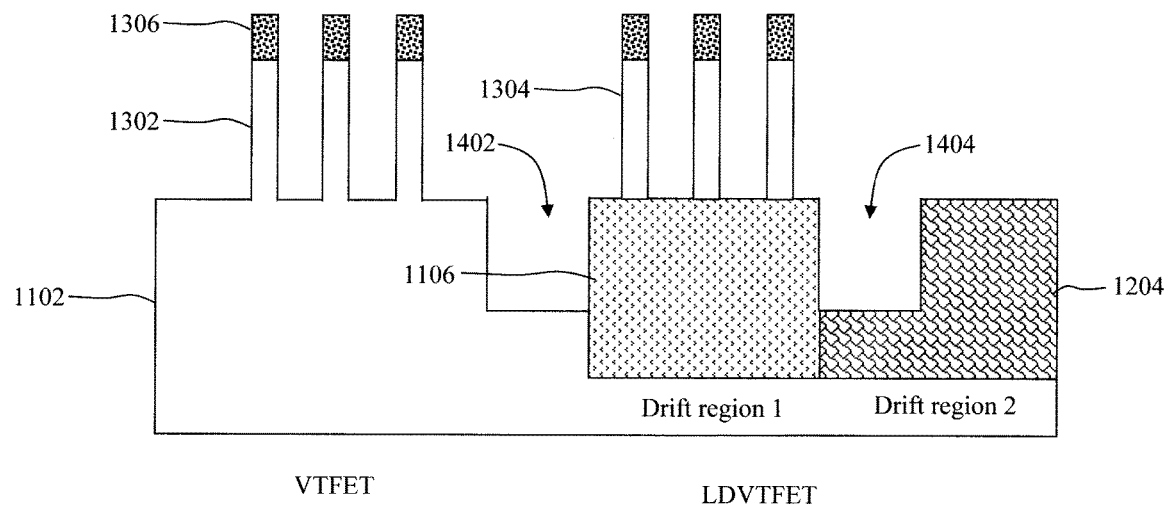
FIG. 14 is a cross-sectional diagram illustrating STI trenches having been patterned in the wafer in between the VTFET and the LDVTFET regions, and in the LDD region between the (first and second) LDD regions according to an embodiment of the present invention.

With the patterning of fins 1302 and 1304 now complete, the next task is to isolate the (VTFET and LDVTFET) devices. According to an exemplary embodiment, shallow trench isolation (STI) is used. For instance, as shown in FIG. 14 an STI trench 1402 is patterned in the wafer 1102 in between the VTFET and the LDVTFET regions. As shown in FIG. 14, STI can also be used to define the LDD (drift) region(s) of the LDVTFET. Namely, as shown in FIG. 14 an STI trench 1404 is formed in the LDD region 1204 (between LDD region 1106 and LDD region 1204).

Figure 15:
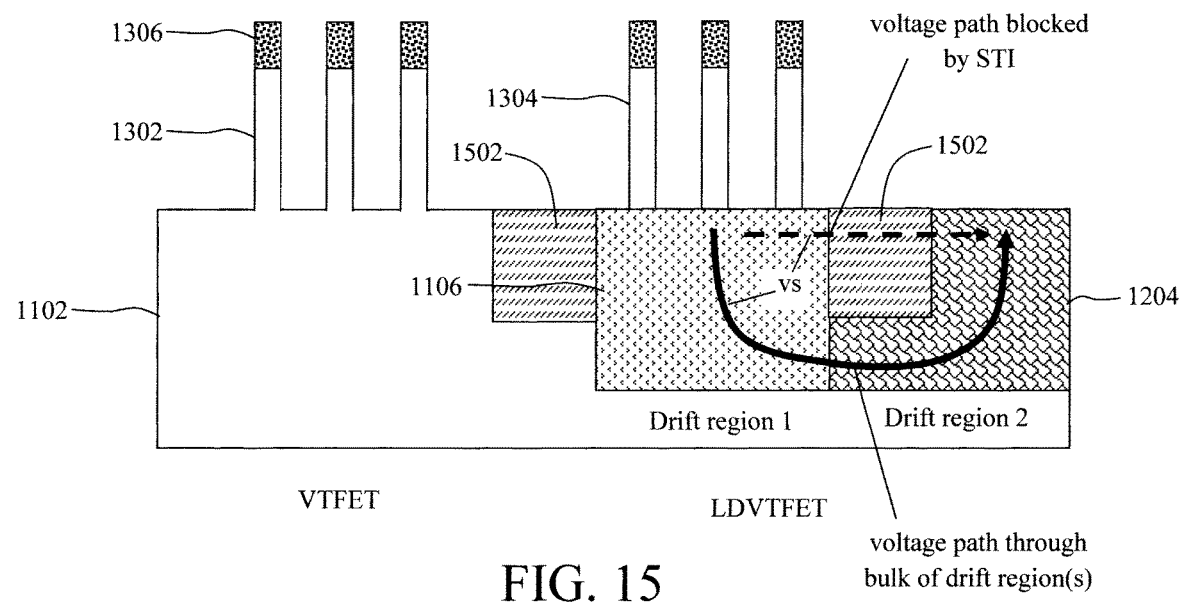
FIG. 15 is a cross-sectional diagram illustrating the STI trenches having been filled with an insulator according to an embodiment of the present invention.

Next, as shown in FIG. 15, the STI trenches 1402 and 1404 are filled with an insulator 1502, such as an STI oxide. As deposited, any excess insulator 1502 can be removed using a process such as chemical-mechanical polishing (CMP). As shown in FIG. 15, insulator 1502 separates the VTFET and LDVTFET regions of the wafer 1102. In the previous example, isolation between the (VTFET and LDVTFET) devices was achieved via gap fill dielectric 502.

Further, insulator 1502 in LDD 1204 helps define the drift region of the LDVTFET. For instance, as shown in FIG. 15 voltage flowing through the LDVTFET has to pass through a bulk of both LDD (drift) regions 1106 and 1204 (see solid arrow). To look at it another way, without insulator 1502 in the drift region, voltage through the LDVTFET could flow along the surface of the drifter region(s) bypassing a majority of LDD (drift) regions 1106 and 1204 (see dashed arrow).

Figure 16:
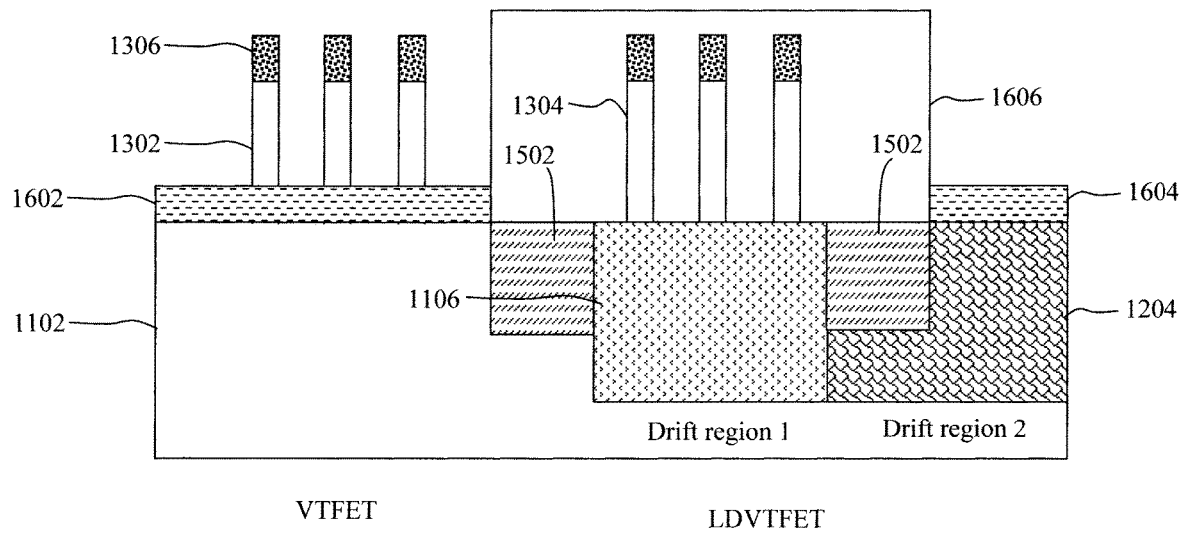
FIG. 16 is a cross-sectional diagram illustrating bottom source and drains having been formed at a base of the (first) fins and on the LDD region according to an embodiment of the present invention.

Bottom source and drains 1602 and 1604 are then formed concurrently for the VTFET and LDVTFET devices, respectively. See FIG. 16. As shown in FIG. 16, the VTFET bottom source and drains 1602 are formed at a base of the fins 1302. However, the LDVTFET bottom source and drains 1604 are formed, not at the base of the fins 1304, but on the LDD (drift) region. Thus, the LDVTFET bottom source and drains 1604 are in a non-contact position with the fins 1304. In this particular example, the LDVTFET bottom source and drains 1604 are formed on top of LDD region 1204.

For selective placement of the VTFET and LDVTFET bottom source and drains, a block mask 1606 can be used to cover the LDVTFET fins 1304. See FIG. 16. According to an exemplary embodiment, the bottom source and drains 1602 and 1604 are formed from a doped epitaxial material grown at the base of the VTFET fins 1302 and on the LDVTFET LDD (drift) region (i.e., LDD region 1204). As above, suitable epitaxial materials for the bottom source and drains 1602 and 1604 include, but are not limited to, epitaxial Si, Ge and/or SiGe that is in-situ doped (i.e., during growth) or ex-situ doped (e.g., via a process such ion implantation) with an n-type or p-type dopant. Suitable n-type dopants include, but are not limited to, phosphorous (P) and/or arsenic (As), and suitable p-type dopants include, but are not limited to, boron (B). Following formation of the bottom source and drains 1602 and 1604, the block mask 1606 can be removed.

Figure 17:
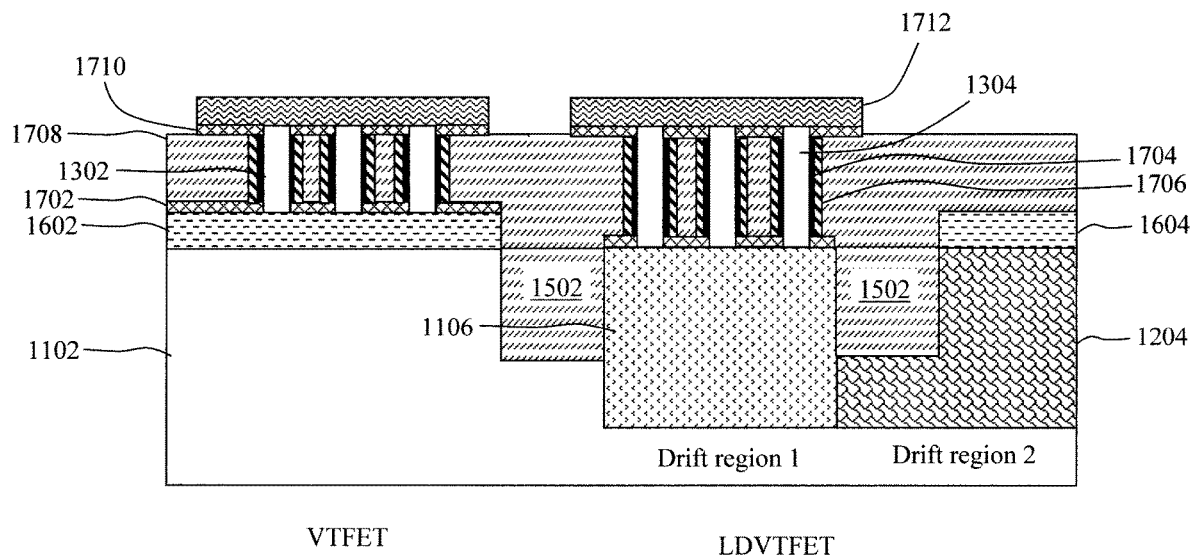
FIG. 17 is a cross-sectional diagram illustrating bottom source and drains having been formed at a base of the (first/second) fins, bottom spacers having been formed directly on the bottom source and drains in the VTFET region and directly on the LDD (drift) region in the LDVTFET region, a gate dielectric having been deposited onto the fins followed by a gate conductor to form gates alongside the (first/second) fins, the (first/second) fins and the gates having been buried in a gap fill dielectric and the gap fill dielectric having been recessed below the tops of the (first/second) fins, top spacers having been formed on the (recessed) gap fill dielectric above the gates, and top source and drains having been formed over the top spacers at the tops of the (first/second) fins according to an embodiment of the present invention.
Figure 18:
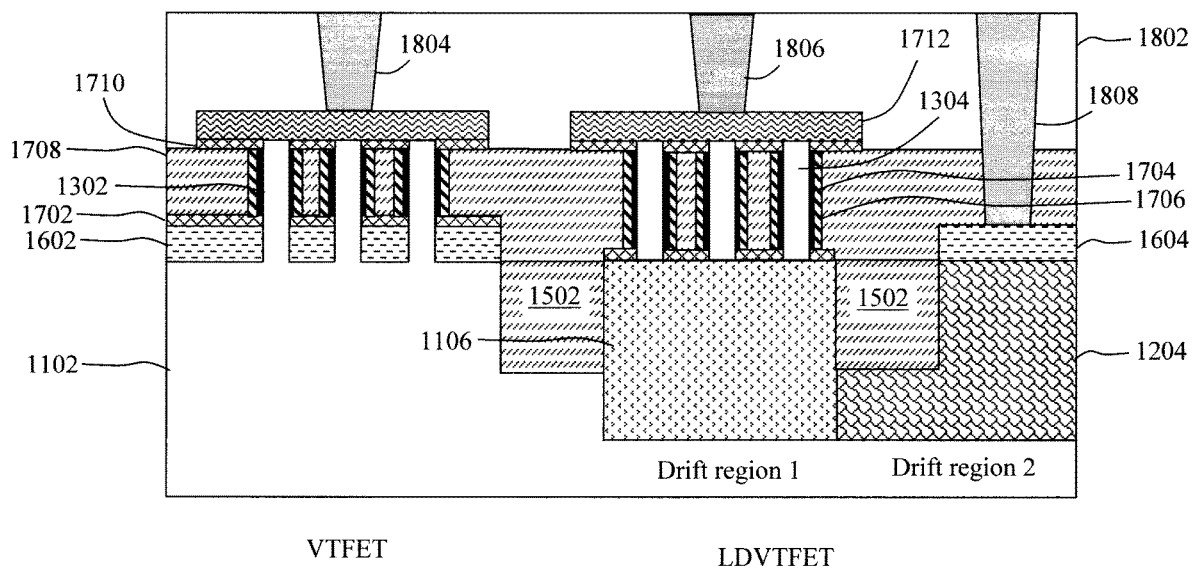
FIG. 18 is a cross-sectional diagram illustrating the VTFET and LDVTFET devices having been buried in an ILD, and contacts having been formed in the ILD to the top source and drains of the VTFET and LDVTFET devices, and to the bottom source and drains of the LDVTFET devices according to an embodiment of the present invention.

In the remainder of the process, the VTFET and LDVTFET devices are processed concurrently. For instance, as shown in FIG. 17, bottom spacers 1702 are then formed directly on the bottom source and drains 1602 in the VTFET region and directly on the LDD (drift) region 1106 in the LDVTFET region.

According to an exemplary embodiment, the bottom spacers 1702 are formed using a directional deposition process whereby a spacer material is deposited onto the bottom source and drains 1602 (in the VTFET region), and the LDD (drift) region 1106 (in the LDVTFET region) and fins 1302/1304 with a greater amount of the material being deposited on the horizontal surfaces, as compared to the vertical surfaces. Thus, when an etch is used on the spacer material, the timing of the etch needed to remove the spacer material from the vertical surfaces will leave the bottom spacers 1702 shown in FIG. 17 on top of the bottom source and drains 1602 (in the VTFET region) and on top of the LDD (drift) region 1106 (in the LDVTFET region) since a greater amount of the spacer material was present on these horizontal surfaces to begin with.

By way of example only, a HDP CVD or PVD process can be used for directional film deposition, and an isotropic etch can be used to remove the (thinner) spacer material deposited onto the vertical surfaces. As above, suitable materials for the bottom spacers 1702 include, but are not limited to, oxide spacer materials such as $SiO_2$ and/or SiCO, and nitride spacer materials such as SiN, SiBCN, SiOCN, and/or SiCN.

Gates (i.e., a gate dielectric and a gate conductor) are then formed alongside the fins 1302/1304 above the bottom spacers 1702. According to an exemplary embodiment, the gates include a gate dielectric 1704 that is deposited onto the fins 1302/1304, and a gate conductor 1706 that is deposited onto the gate dielectric 1704. See FIG. 17. Again, this formation of the gates occurs concurrently in both (VTFET and LDVTFET) regions. In one exemplary embodiment, the conformal gate conductor 1706 is a workfunction-setting metal, and the conformal gate dielectric 1704 is a high-κ gate dielectric.

The particular workfunction-setting metal employed can vary depending on whether an n-type or p-type transistor is desired. As provided above, suitable n-type workfunction-setting metals include, but are not limited to, TiN, TaN and/or Al-containing alloys such as TiAl, TiAlN, TiAlC, TaAl, TaAlN, and/or TaAlC. Suitable p-type workfunction-setting metals include, but are not limited to, TiN, TaN, and/or W. Suitable high-κ gate dielectrics include, but are not limited to, $HfO_2$ and/or $La_2O_3$.

In order to enable further processing above the gates at the tops of the fins 1302/1304, the fins 1302 and 1304 and the gates are next buried in a gap fill dielectric 1708. The gap fill dielectric 1708 is then recessed below the tops of the fins 1302/1304. See FIG. 17. As provided above, suitable gap fill dielectrics 1708 include, but are not limited to, oxides such as $SiO_2$, OPL, etc.

Top spacers 1710 are then formed on the (recessed) gap fill dielectric 1708 above the gates. As with the bottom spacers 1702, top spacers 1710 can be formed using a directional deposition process whereby a spacer material is deposited onto the recessed gap fill dielectric 1708 above the gates with a greater amount of the material being deposited on the horizontal surfaces, as compared to the vertical surfaces. Thus, when an etch is used on the spacer material, the timing of the etch needed to remove the spacer material from the vertical surfaces will leave the top spacers 1710 shown in FIG. 17 on top of recessed gap fill dielectric 1708 since a greater amount of the spacer material was present on these horizontal surfaces to begin with.

As provided above, a HDP CVD or PVD process can be used for directional film deposition, and an isotropic etch can be used to remove the (thinner) spacer material deposited onto the vertical surfaces. As with the bottom spacers 1702, suitable materials for the top spacers 1710 include, but are not limited to, oxide spacer materials such as $SiO_2$ and/or SiCO, and nitride spacer materials such as SiN, SiBCN, SiOCN, and/or SiCN.

The patterned hardmask 1306 (atop the fins 1302/1304) are then removed and top source and drains 1712 are formed over the top spacers 1710 at the tops of the fins 1302/1304.

According to an exemplary embodiment, the top source and drains 1712 are formed from a doped epitaxial material grown at the tops of the fins 1302 and 1304 over the top spacers 1710. Suitable epitaxial materials for the top source and drains 1712 include, but are not limited to, epitaxial Si, Ge and/or SiGe that is in-situ doped (i.e., during growth) or ex-situ doped (e.g., via a process such ion implantation) with an n-type or p-type dopant. As provided above, suitable n-type dopants include, but are not limited to, phosphorous (P) and/or arsenic (As), and suitable p-type dopants include, but are not limited to, boron (B).

Metallization is then performed to form contacts to the VTFET and LDVTFET devices. For instance, the VTFET and LDVTFET devices are buried in an ILD 1802. See FIG. 18. Contacts 1804 and 1806 are then formed in the ILD 1802 to the top source and drains of the VTFET and LDVTFET devices, respectively, and a contact 1808 is formed in the ILD 1802 to the bottom source and drains 1604 of the LDVTFET devices.

According to an exemplary embodiment, the contacts 1804, 1806 and 1808 are formed by first patterning contact trenches in the ILD 1802, and then filling the contact trenches with a suitable contact metal such as Cu, W, Ti and/or Pt to form contacts 1804, 1806 and 1808.

In the exemplary embodiment just described, a simplified fin patterning scheme was employed using a common fin etch to form the fins in both types (VTFET and LDVTFET) of devices. Another variation of the present techniques is now described by way of reference to FIGS. 19-24 where a two-step fin etch is again employed (as in the first exemplary embodiment) to co-fabricate nominal VTFET and long channel VTFET devices on the same wafer. However, with the long channel VTFET no extra LDD doping is needed thereby simplifying the process flow. With regard to long channel device and high voltage applications, increasing the channel length serves to reduce the magnitude of the lateral electric field in the channel region beneath the gate.

Figure 19:
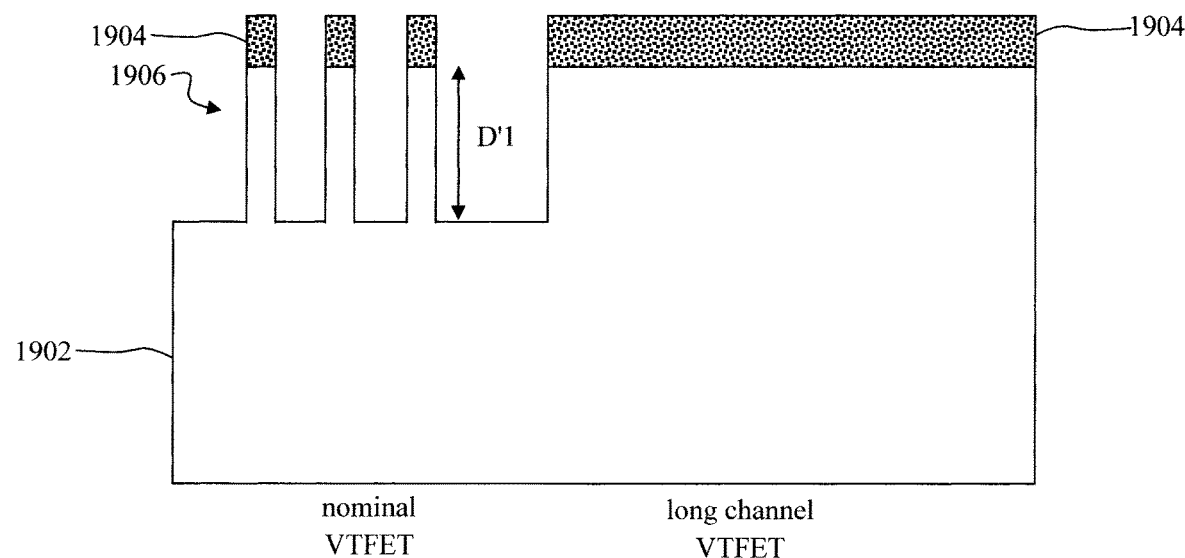
FIG. 19 is a cross-sectional diagram illustrating a wafer having a VTFET region and a LDVTFET region, and (first) fins having been patterned in the VTFET region of the wafer to a depth D1 according to an embodiment of the present invention.

As shown in FIG. 19, the process begins in the same general manner as above with a (e.g., bulk semiconductor or SOI) wafer 1902 having at least one first active region and at least one second active region in which a VTFET and a long channel VTFET will be formed, respectively. Fins 1906 are patterned in the VTFET region of the wafer 1902. To do so, standard lithography and etching techniques are used to first form a patterned hardmask 1904 on the wafer 1902. The patterned hardmask 1904 i) marks the footprint and location of the fins 1906 in the VTFET region of wafer 1902, and ii) blocks off the long channel VTFET region of wafer 1902. As provided above, suitable hardmask materials include, but are not limited to, oxide hardmask materials such as $SiO_2$ and/or SiCO, and nitride materials such as SiN, SiBCN, SiOCN, and/or SiCN. An anisotropic etching process such as RIE can be employed for the fin etch.

Fins 1906 will serve as the vertical fin channels of the VTFETs. According to an exemplary embodiment, the fins 1906 are undoped. As shown in FIG. 19, the fins 1906 are patterned to a depth D'1 in the wafer 1902.

With the patterning of fins 1906 now complete in the VTFET region of wafer 1902, the fins 1906 are covered with a block mask 2002 in order to enable selective processing of the long channel VTFET region of the wafer 1902. See FIG. 20. Standard lithography and etching techniques are then used to further pattern the hardmask 1904 (now given reference numeral 1904*a*) marking the footprint and location of fins 2004 in the long channel VTFET region of the wafer 1902.

Figure 20:
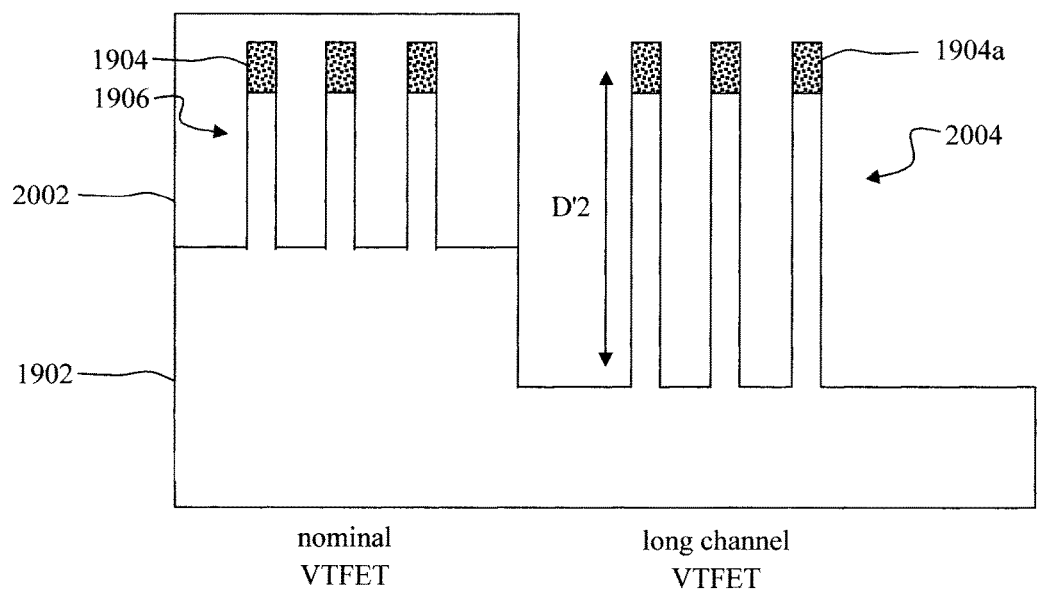
FIG. 20 is a cross-sectional diagram illustrating (second) fins having been patterned in the LDVTFET region of wafer to a depth D2>D1 according to an embodiment of the present invention.

As shown in FIG. 20, the patterned hardmask 1904*a* is then used to pattern the fins 2004 to a depth D'2 in the long channel VTFET region of wafer 1902. Fins 2004 will serve as the vertical fin channels of the long channel VTFETs. According to an exemplary embodiment, the fins 2004 are undoped. In this exemplary embodiment, depth D'2 is greater than depth D'1 (i.e., the depth of the fins 2004 in the VTFET region of wafer 1902—see above, namely D'2>D'1). It is notable that, as shown in FIG. 20, the fins 1906 and 2004 can have the same pitch. However, since the fins 1906 and 2004 are being patterned in two separate steps, the pitch of the VTFET fins is independent of the pitch of the long channel FET fins, and embodiments are contemplated herein where the pitch of fins 1906 is different from the pitch of fins 2004.

Following the etch of fins 2004, the block mask 2002 can be removed, as well as the patterned hardmasks 1904/1904*a*. See FIG. 21. Bottom source and drains 2102 are then formed at the base of the fins 1906 and 2004. Advantageously, post-fin patterning the same treatments are applied to the VTFET and long channel VTFET regions, i.e., from this point forward in the process flow the VTFET and long channel VTFET devices are processed concurrently.

Figure 21:
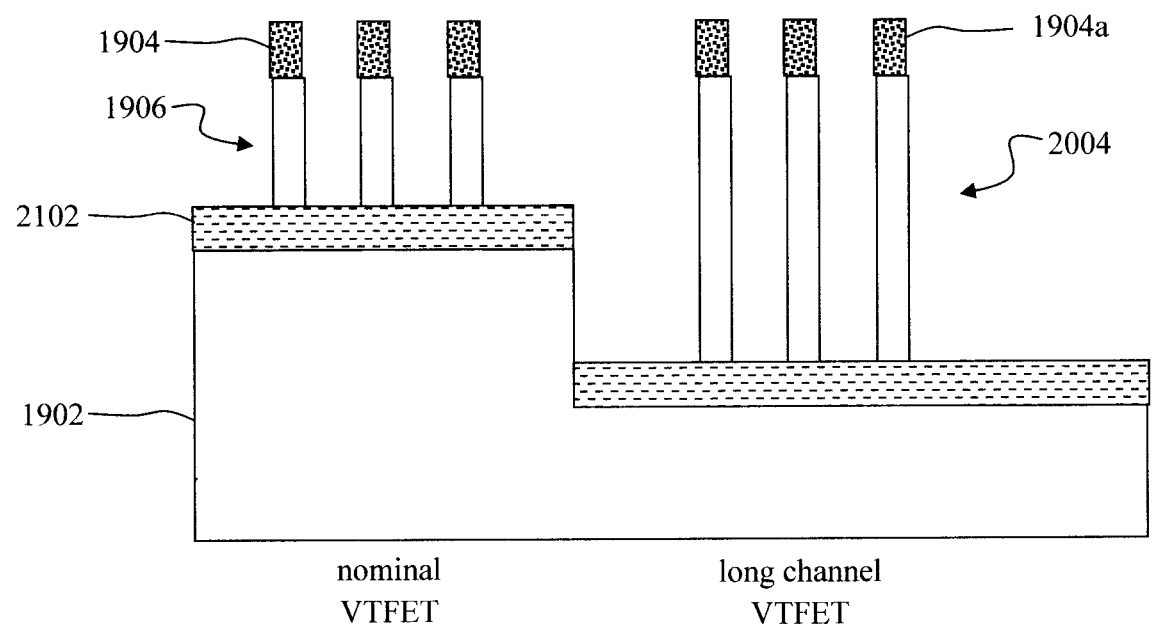
FIG. 21 is a cross-sectional diagram illustrating bottom source and drains having been formed at a base of the (first/second) fins according to an embodiment of the present invention.
Figure 22:
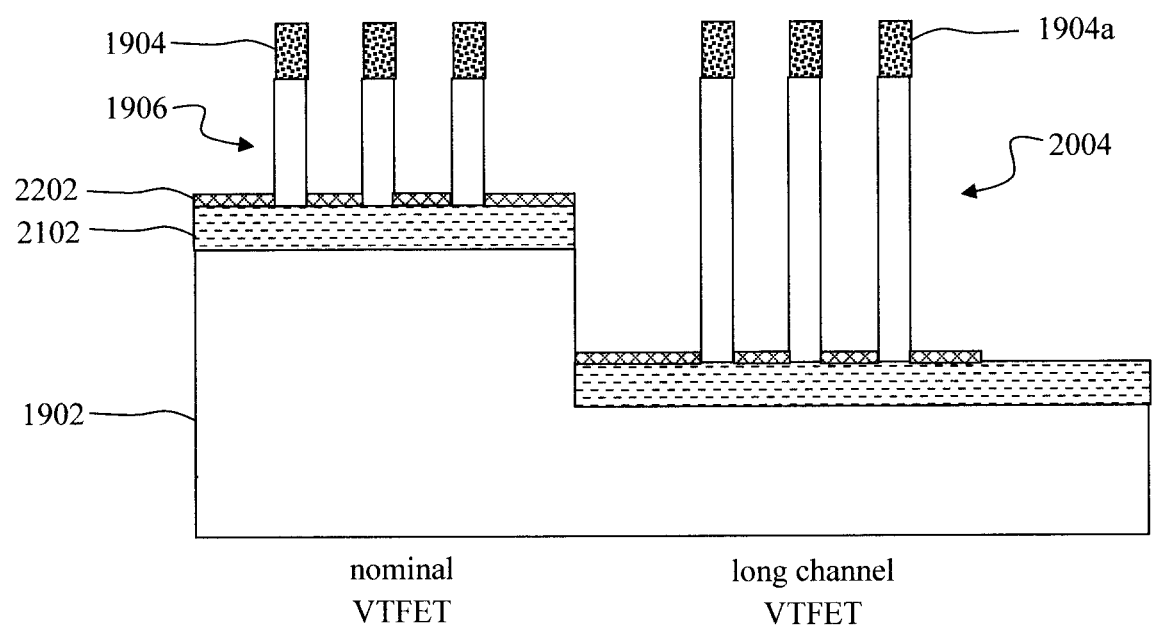
FIG. 22 is a cross-sectional diagram illustrating bottom spacers having been formed directly on the bottom source and drains in both the VTFET and long channel VTFET regions according to an embodiment of the present invention.
Figure 23:
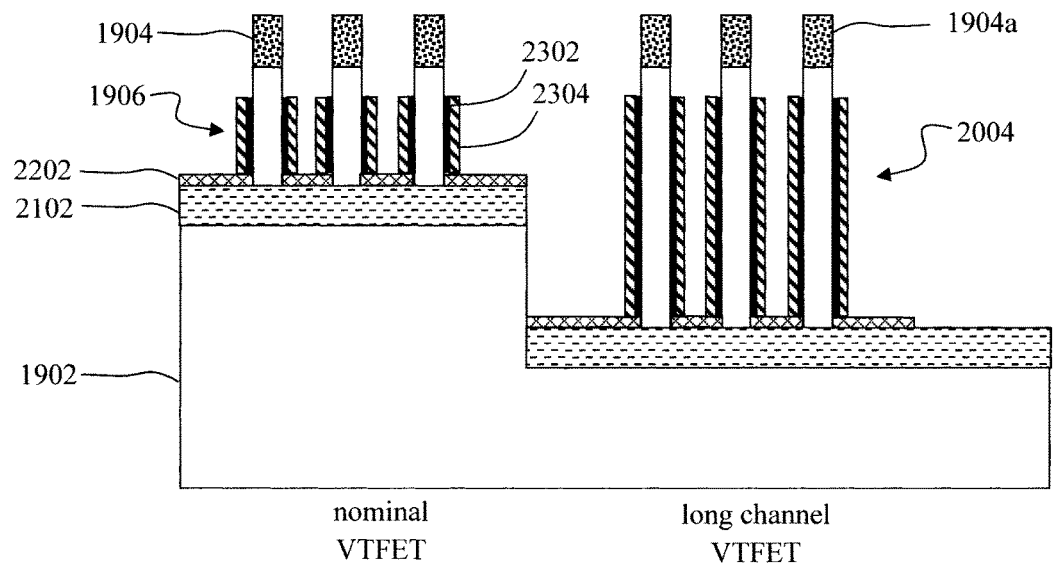
FIG. 23 is a cross-sectional diagram illustrating a gate dielectric having been deposited onto the fins followed by a gate conductor to form gates alongside the (first/second) fins according to an embodiment of the present invention.
Figure 24:
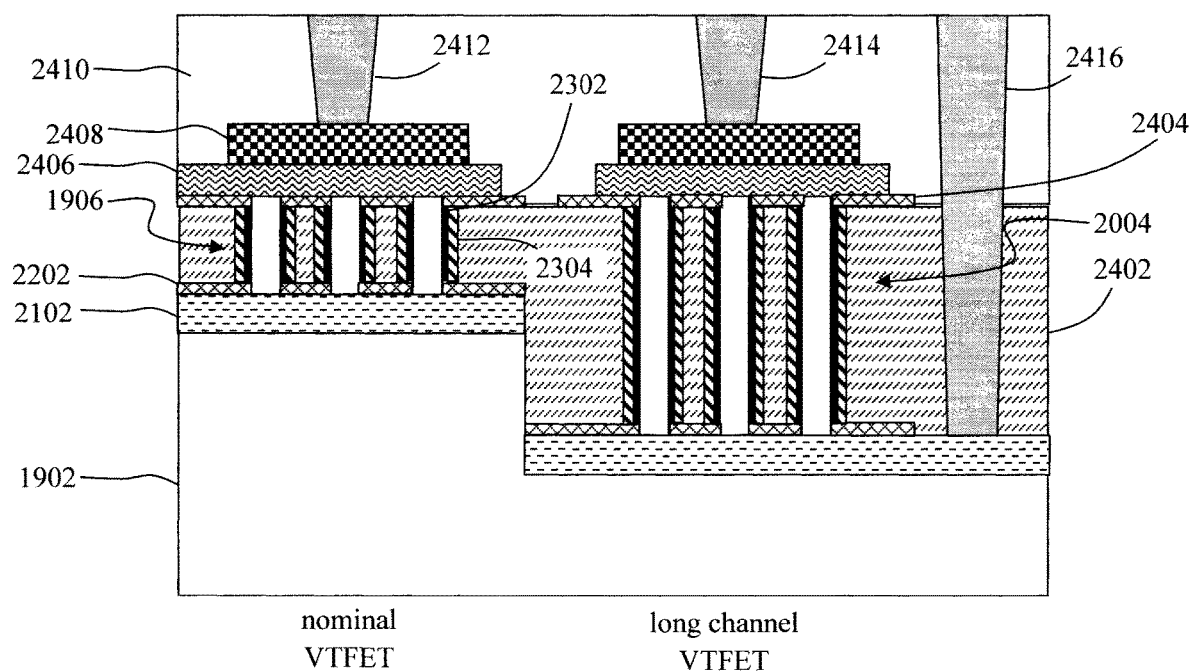
FIG. 24 is a cross-sectional diagram illustrating the (first/second) fins and the gates having been buried in a gap fill dielectric and the gap fill dielectric having been recessed below the tops of the (first/second) fins, top spacers having been formed on the (recessed) gap fill dielectric above the gates, top source and drains having been formed over the top spacers at the tops of the (first/second) fins, the VTFET and LDVTFET devices having been buried in an ILD, and contacts having been formed in the ILD to the top source and drains of the VTFET and LDVTFET devices, and to the bottom source and drains of the LDVTFET devices according to an embodiment of the present invention.

For instance, as shown in FIG. 21 the bottom source and drains 2102 are formed concurrently at the base of the fins 1906 and 2004 in both the VTFET and long channel VTFET regions of wafer 1902. According to an exemplary embodiment, the bottom source and drains 2102 are formed from a doped epitaxial material grown at the base of the fins 1906 and 2004. Suitable epitaxial materials for the bottom source and drains 2102 include, but are not limited to, epitaxial Si, Ge and/or SiGe that is in-situ doped (i.e., during growth) or ex-situ doped (e.g., via a process such ion implantation) with an n-type or p-type dopant. As provided above, suitable n-type dopants include, but are not limited to, phosphorous (P) and/or arsenic (As), and suitable p-type dopants include, but are not limited to, boron (B).

Unlike the first (two-step fin etch) exemplary embodiment provided above, the goal here is to produce gates of differing length alongside the nominal VTFETs as compared to the long channel long channel VTFETs. Thus, bottom spacers 2202 are next formed directly on the bottom source and drains 2102 in both the VTFET and long channel VTFET regions. See FIG. 22.

According to an exemplary embodiment, the bottom spacers 2202 are formed using a directional deposition process whereby a spacer material is deposited onto the bottom source and drains 2102 in both the VTFET and long channel VTFET regions and fins 1906/2004 with a greater amount of the material being deposited on the horizontal surfaces, as compared to the vertical surfaces. Thus, when an etch is used on the spacer material, the timing of the etch needed to remove the spacer material from the vertical surfaces will leave the bottom spacers 2202 shown in FIG. 22 on top of the bottom source and drains 2102 in the VTFET and long channel VTFET regions since a greater amount of the spacer material was present on these horizontal surfaces to begin with.

As provided above, an HDP CVD or PVD process can be used for directional film deposition, and an isotropic etch can be used to remove the (thinner) spacer material deposited onto the vertical surfaces. Suitable materials for the bottom spacers 2202 include, but are not limited to, oxide spacer materials such as $SiO_2$ and/or SiCO, and nitride spacer materials such as SiN, SiBCN, SiOCN, and/or SiCN.

Gates (i.e., a gate dielectric and a gate conductor) are then formed alongside the fins 1906/2004 above the bottom spacers 2202. According to an exemplary embodiment, the gates include a gate dielectric 2302 that is deposited onto the fins 1906/2004, and a gate conductor 2304 that is deposited onto the gate dielectric 2302. See FIG. 23. Again, this formation of the gates occurs concurrently in both (VTFET and long channel VTFET) regions. In one exemplary embodiment, the conformal gate conductor 2304 is a work-function-setting metal, and the conformal gate dielectric 2302 is a high-K gate dielectric.

The particular workfunction-setting metal employed can vary depending on whether an n-type or p-type transistor is desired. As provided above, suitable n-type workfunction-setting metals include, but are not limited to, TiN, TaN and/or Al-containing alloys such as TiAl, TiAlN, TiAlC, TaAl, TaAlN, and/or TaAlC. Suitable p-type workfunction-setting metals include, but are not limited to, TiN, TaN, and/or W. Suitable high-K gate dielectrics include, but are not limited to, $HfO_2$ and/or $La_2O_3$.

In order to enable further processing above the gates at the tops of the fins 1906/2004, the fins 1906 and 2004 and the gates are next buried in a gap fill dielectric 2402. The gap fill dielectric 2402 is then recessed below the tops of the fins 1906/2004. See FIG. 24. As provided above, suitable gap fill dielectrics 2402 include, but are not limited to, oxides such as $SiO_2$, OPL, etc.

Top spacers 2404 are then formed on the (recessed) gap fill dielectric 2402 above the gates. As with the bottom spacers 2202, top spacers 2404 can be formed using a directional deposition process whereby a spacer material is deposited onto the recessed gap fill dielectric 2402 above the gates with a greater amount of the material being deposited on the horizontal surfaces, as compared to the vertical surfaces. Thus, when an etch is used on the spacer material, the timing of the etch needed to remove the spacer material from the vertical surfaces will leave the top spacers 2404 shown in FIG. 24 on top of recessed gap fill dielectric 2402 since a greater amount of the spacer material was present on these horizontal surfaces to begin with.

As provided above, a HDP CVD or PVD process can be used for directional film deposition, and an isotropic etch can be used to remove the (thinner) spacer material deposited onto the vertical surfaces. As with the top spacers, suitable materials for the top spacers 2404 include, but are not limited to, oxide spacer materials such as $SiO_2$ and SiCO, and nitride spacer materials such as SiN, SiBCN, SiOCN, and/or SiCN.

Top source and drains 2406 are then formed over the top spacers 2404 at the tops of the fins 1906/2004. According to an exemplary embodiment, the top source and drains 2406 are formed from a doped epitaxial material grown at the tops of the fins 1906 and 2004 over the top spacers 2404. Suitable epitaxial materials for the top source and drains 2406 include, but are not limited to, epitaxial Si, Ge and/or SiGe that is in-situ doped (i.e., during growth) or ex-situ doped (e.g., via a process such ion implantation) with an n-type or p-type dopant. As provided above, suitable n-type dopants include, but are not limited to, phosphorous (P) and/or arsenic (As), and suitable p-type dopants include, but are not limited to, boron (B).

Metallization is then performed to form contacts to the VTFET and long channel VTFET devices. For instance, top source and drain contacts 2408 are formed (e.g., grown epitaxially) on the top source and drains 2406. Next, the VTFET and LDVTFET devices are then buried in an ILD 2410. Contacts 2412 and 2414 are then formed in the ILD 2410 to the top source and drains of the VTFET and long channel VTFET devices, respectively, and a contact 2416 is formed in the ILD 2410 to the bottom source and drains 2102 of the long channel VTFET devices.

According to an exemplary embodiment, the contacts 2412, 2414 and 2416 are formed by first patterning contact trenches in the ILD 2410, and then filling the contact trenches with a suitable contact metal such as Cu, W, Ti and/or Pt to form contacts 2412, 2414 and 2416.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming a device having a vertical fin field-effect transistor (VTFET) and a lateral diffusion VTFET (LDVTFET), the method comprising the steps of:
    forming a lightly-doped drain (LDD) in an LDVTFET region of a wafer;
    selectively patterning at least one fin in a VTFET region of the wafer to a depth D1;
    selectively patterning at least one fin in the LDVTFET region of the wafer, through the LDD, to a depth D2, wherein D2>D1;
    forming bottom source and drains at a base of the at least one fin in the VTFET region and the at least one fin in the LDVTFET region;
    burying the at least one fin in the VTFET region and the at least one fin in the LDVTFET region in a gap fill dielectric;
    recessing the gap fill dielectric to fully expose the at least one fin in the VTFET region and partially expose the at least one fin in the LDVTFET region;
    forming bottom spacers directly on the bottom source and drains in the VTFET region of the wafer and directly on the recessed gap fill dielectric in the LDVTFET region of the wafer;
    forming gates alongside the at least one fin in the VTFET region and the at least one fin in the LDVTFET region above the bottom spacers;
    forming top spacers above the gates; and
    forming top source and drains above the top spacers at tops of the at least one fin in the VTFET region and the at least one fin in the LDVTFET region.

2. The method of claim 1, wherein the at least one fin in the VTFET region comprises a vertical fin channel of the VTFET.

3. The method of claim 1, wherein the LDD has a dopant concentration of from about $1\times10^{15}$ atoms/$cm^3$ to about $1\times10^{18}$ atoms/$cm^3$, and ranges therebetween.

4. The method of claim 1, wherein the at least one fin in the LDVTFET region comprises a vertical fin channel of the LDVTFET, and a drift region of the LDVTFET.

5. A method of forming a device having a vertical fin field-effect transistor (VTFET) and a long channel VTFET, the method comprising the steps of:
    selectively patterning at least one fin only in a VTFET region of a wafer to a depth D'1;
    after selectively patterning the at least one fin only in the VTFET region of the wafer, selectively patterning at least one fin in a long channel VTFET region of the wafer to a depth D'2, wherein D'2>D'1;
    forming bottom source and drains at a base of the at least one fin in the VTFET region and the at least one fin in the long channel VTFET region;

forming bottom spacers directly on the bottom source and drains in both the VTFET region and the long channel VTFET region of the wafer;

forming gates alongside the at least one fin in the VTFET region and the at least one fin in the long channel VTFET region above the bottom spacers;

forming top spacers above the gates; and forming top source and drains above the top spacers at tops of the at least one fin in the VTFET region and the at least one fin in the long channel VTFET region.

6. The method of claim 5, wherein the at least one fin in the VTFET region comprises a vertical fin channel of the VTFET, and wherein the at least one fin in the long channel VTFET region comprises a vertical fin channel of the long channel VTFET.

* * * * *